US010709025B2

(12) United States Patent
Lee et al.

(10) Patent No.: US 10,709,025 B2
(45) Date of Patent: Jul. 7, 2020

(54) DISPLAY DEVICE

(71) Applicant: LG ELECTRONICS INC., Seoul (KR)

(72) Inventors: Jaegi Lee, Seoul (KR); Jaecheol Kim, Seoul (KR); Boreum Lee, Seoul (KR); Seunghyeon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/026,616

(22) Filed: Jul. 3, 2018

(65) Prior Publication Data
US 2019/0014670 A1  Jan. 10, 2019

(30) Foreign Application Priority Data
Jul. 4, 2017 (KR) .......................... 10-2017-0084826

(51) Int. Cl.
H05K 5/00 (2006.01)
H01L 51/52 (2006.01)
H05K 5/02 (2006.01)
H05K 5/03 (2006.01)
H05K 7/20 (2006.01)
(Continued)

(52) U.S. Cl.
CPC ......... H05K 5/0017 (2013.01); G06F 1/1601 (2013.01); H01L 51/5237 (2013.01); H05K 5/0008 (2013.01); H05K 5/0217 (2013.01); H05K 5/0247 (2013.01); H05K 5/03 (2013.01); H05K 7/20972 (2013.01); H01L 27/3276 (2013.01)

(58) Field of Classification Search
CPC ............... H05K 5/0017; H05K 5/0217; H05K 7/20972; H05K 5/0247; H05K 5/03; H05K 5/0008; G06F 1/1601; H01L 51/5237; H01L 27/3276
See application file for complete search history.

(56) References Cited

U.S. PATENT DOCUMENTS 5,978,211 A * 11/1999 Hong ..................... F16M 11/10
                                                        361/679.23
7,864,545 B2 * 1/2011 Kim ................... H05K 7/20963
                                                        361/679.21
(Continued)

FOREIGN PATENT DOCUMENTS

CN        204423818 U    6/2015
CN        205560147 U    9/2016
(Continued)

OTHER PUBLICATIONS

European Search Report dated Nov. 6, 2018 issued in EP Application No. 18181095.3.
(Continued)

Primary Examiner — Rockshana D Chowdhury
(74) Attorney, Agent, or Firm — KED & Associates LLP

(57) ABSTRACT

A display device comprises a display panel; a plate including a first portion at a rear of the display panel, wherein the display panel is fixed on the first portion; and a second portion that extends from a lower side of the first portion, the second portion bent toward a front of the first portion from the first portion; and a housing at a rear of the second portion of the plate, the housing coupled with the second portion of the plate.

22 Claims, 57 Drawing Sheets

(51) Int. Cl.
*G06F 1/16* (2006.01)
*H01L 27/32* (2006.01)

(56) References Cited

U.S. PATENT DOCUMENTS

| | | | | |
|---|---|---|---|---|
| 2005/0213290 A1* | 9/2005 | Lauffer | ............... | G06F 1/1601 |
| | | | | 361/679.21 |
| 2007/0195495 A1* | 8/2007 | Kim | ............... | F16M 11/105 |
| | | | | 361/679.07 |
| 2011/0007230 A1* | 1/2011 | Yamamoto | ......... | G02F 1/133604 |
| | | | | 348/794 |
| 2013/0265505 A1* | 10/2013 | Hirofumi | ............ | H04N 5/642 |
| | | | | 348/843 |
| 2014/0293140 A1 | 10/2014 | Tsuzuki | | |
| 2015/0016091 A1* | 1/2015 | Chang | ............... | G02F 1/133608 |
| | | | | 362/97.1 |
| 2016/0044802 A1* | 2/2016 | Kim | ............... | G02F 1/133308 |
| | | | | 361/679.01 |
| 2016/0192523 A1* | 6/2016 | Lin | ............... | G02F 1/133308 |
| | | | | 361/679.01 |
| 2017/0034934 A1 | 2/2017 | Kim et al. | | |
| 2017/0064851 A1* | 3/2017 | Shin | ............... | G06F 1/206 |
| 2017/0181295 A1 | 6/2017 | Gu et al. | | |

FOREIGN PATENT DOCUMENTS

| | | |
|---|---|---|
| CN | 106409162 A | 2/2017 |
| CN | 106486517 A | 3/2017 |
| CN | 106898631 A | 6/2017 |
| CN | 101952644 A | 1/2019 |
| EP | 3 125 027 | 2/2017 |
| EP | 3 136 714 | 3/2017 |
| KR | 10-2017-0062937 | 6/2017 |

OTHER PUBLICATIONS

Chinese Office Action dated Apr. 13, 2020 issued in Application 201810724343.0 (with English translation).

* cited by examiner (a)

(b)

(a)

(b)

DISPLAY DEVICE

CROSS-REFERENCE TO RELATED APPLICATION(S)

This application claims the benefit of Korean Patent Application No. 10-2017-0084826 filed in Korea on Jul. 4, 2017, the entire contents of which are incorporated herein by reference for all purposes as if fully set forth herein.

BACKGROUND

1. Field

The present invention is related to a display device.

2. Background

As the information society develops, the demand for display devices is increasing in various forms. Recently, various display devices such as a liquid crystal display device (LCD), a plasma display panel (PDP), an electro luminescent display (ELD), a vacuum fluorescent display (VFD), and an organic light emitting diode (OLED), for example, have been studied.

Among them, the OLED panel may display an image by depositing an organic layer capable of emitting light on a substrate on which a transparent electrode is formed. OLED panels may be not only thin but may also have flexible characteristics. Many studies have been made on the structural characteristics of a display device having such an OLED panel. In recent years, a sound system or an image control system, which can be provided in a display device, tends to be separated from a display panel, and research on those systems has been actively conducted.

BRIEF DESCRIPTION OF THE DRAWINGS

The embodiments will be described in detail with reference to the following drawings in which like reference numerals refer to like elements wherein.

DETAILED DESCRIPTION

Hereinafter, an organic light emitting diode (OLED) will be described as an example of the display panel. However, the display panel applicable to the embodiments is not limited to the OLED panel. The display panel applicable to the embodiments may be a plasma display panel (PDP), a field emission display (FED), or a liquid crystal display (LCD), as well as OLED panel.

Figure 1:
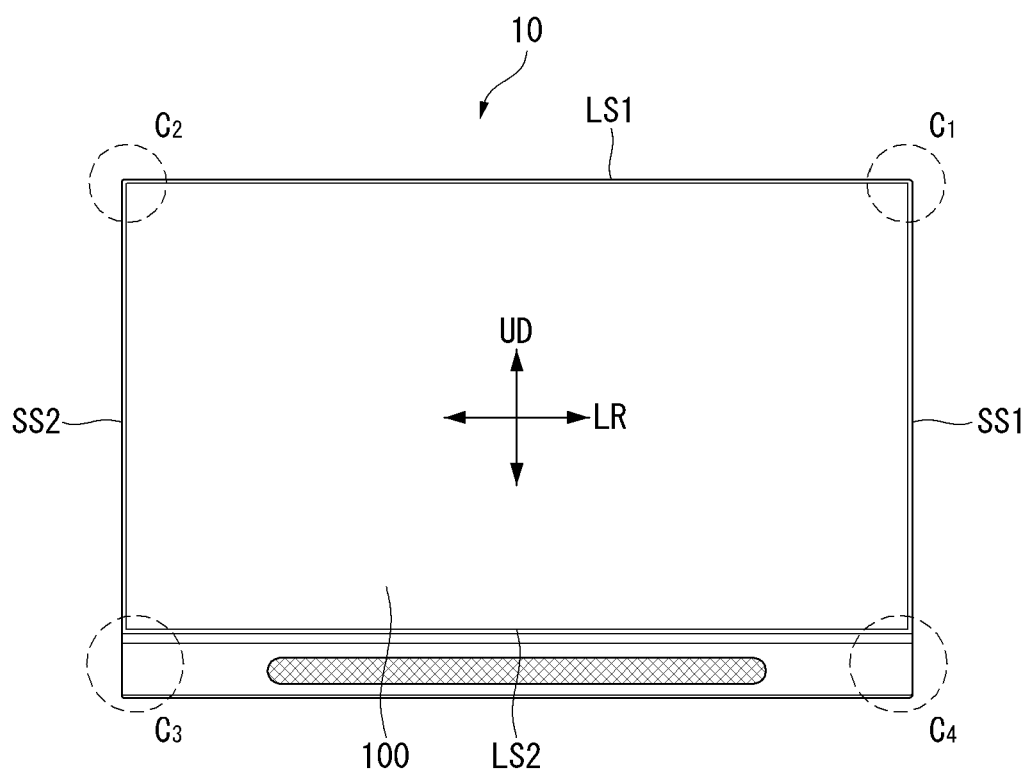
FIG. 1 illustrates an example of a display device according to an embodiment.
Figure 1:
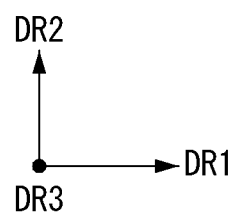

Referring to FIG. 1, a display panel 100a or head portion 10 may include a first long side LS1, a second long side LS2, a first short side SS1, and a second short side SS2. The second long side LS2 may be opposite to the first long side LS1. The second short side SS2 may be opposite to the first short side SS1. The first short side SS1 may be adjacent to the first long side LS1 and the second long side LS2.

A region adjacent to the first short side SS1 may be a first short side region SS1. The first short side region SS1 may be referred to as a first side region. A region adjacent to the second short side SS2 may be a second short side region SS2. The first short side region SS1 may be referred to as a second side region. A region adjacent to the first long side LS1 may be a first long side region LS1. The first long side region LS1 may be referred to as a third side region. A region adjacent to the second long side LS2 may be a second long side region LS2. The second long side region LS2 may be referred to as a fourth side region.

The lengths of the first and second long sides LS1 and LS2 may be longer than the lengths of the first and second short sides SS1 and SS2. However, it is also possible that the lengths of the first and second long sides LS1 and LS2 are substantially equal to the lengths of the first and second short sides SS1 and SS2.

The first direction DR1 may be a direction parallel to the long side LS1 and LS2 of the display panel 100a and the second direction DR2 may be a direction parallel to the short side SS1 and SS2 of the display panel 100a. The third direction DR3 may be a direction perpendicular to the first direction DR1 and/or the second direction DR2.

A side on which the head portion 10 of the display device displays an image may be referred to as a 'forward direction', a 'front side', or a 'front surface'. A side on which the head portion 10 of the display device can not observe the image may be referred to as a 'backward direction' or a 'rearward direction' or a 'back side' or a 'rear side' or a 'back surface' or a 'rear surface'. When looking at the head portion 10 of the display device from the front side of the head portion 10, the first long side LS1 side may be referred to as a 'upward direction' or a 'upper side' or a 'upper surface'. Likewise, the second long side LS2 may be referred to as a 'downward direction' or a 'lower side' or 'a lower surface'. Similarly, the first short side SS1 may be referred to as a 'right direction' or a 'right side' or a 'right surface', and the second short side SS2 may be referred to as a 'left direction' or a 'left side' or a 'left surface'.

The first long side LS1, the second long side LS2, the first short side SS1 and the second short side SS2 may be referred to as an edge of the head portion 10 of the display device. A point where the first long side LS1, the second long side LS2, the first short side SS1, and the second short side SS2 meet with each other may be referred to as a corner. A point at which the first long side LS1 and the first short side SS1 meet each other may be referred to as a first corner C1. A point at which the first long side LS1 and the second short side SS2 meet each other may be referred to as a second corner C2. A point at which the second short side SS2 meets the second long side LS2 may be referred to as a third corner C3. A point at which the second long side LS2 meets the first short side SS1 may be referred to as a fourth corner C4.

A direction from the first short side SS1 to the second short side SS2 or a direction from the second short side SS2 to the first short side SS1 may be referred to as the left and right direction LR. A direction from the first long side LS1 to the second long side LS2 or a direction from the second long side LS2 to the first long side LS1 may be referred to as the up and down direction UD.

Figure 2:
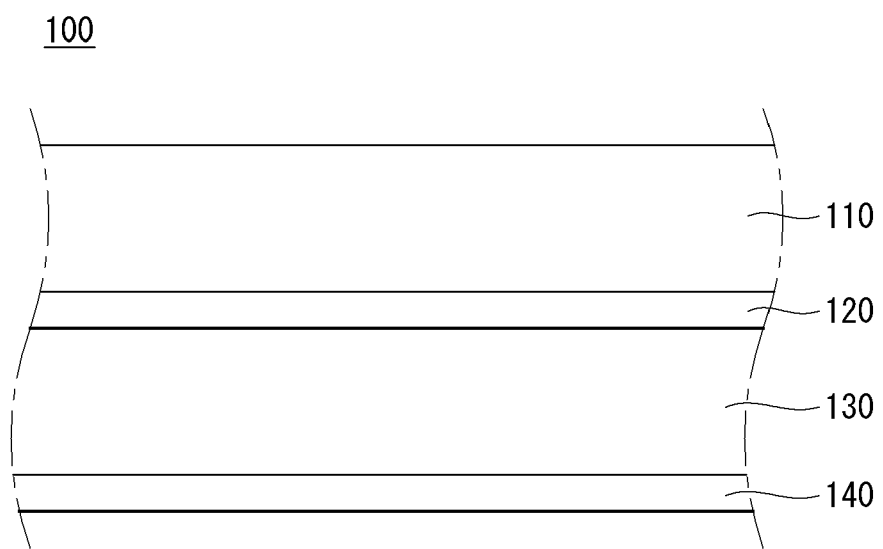
FIG. 2 illustrates an example of a display panel according to an embodiment.

Referring to FIG. 2, the display panel 100a may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed. The arrangement of the components of the display panel 100a may be different depending on the type of the OLED panel. The display panel 100a may include a top emission type and a bottom emission type.

The transparent substrate 110 and the upper electrode 120 may include a transparent material (e.g., ITO, etc.). The lower electrode 140 may include a material that is not transparent. The lower electrode 140 may include a transparent material (for example, ITO or the like). In this case, light may be emitted through the lower electrode 140.

When an electric voltage is applied to the upper and lower electrodes 120 and 140, light emitted from the organic light emitting layer 130 may be transmitted toward outside through the upper electrode 120 and the transparent substrate 110. A light shielding plate may be further provided behind the lower electrode 140 to reflect light emitted to the lower electrode 140 to the front (toward the transparent substrate 110).

For example, the display device may be an organic light emitting diode (OLED) display device. The active matrix type organic light emitting display panel may include an organic light emitting diode (OLED) that emits light by itself, has a high response speed, and has a high luminous efficiency, luminance, and viewing angle.

The OLED, which is a self-luminous device, may include an anode electrode, a cathode electrode, and organic compound layers (HIL, HTL, EML, ETL, EIL) formed therebetween. The organic compound layer may include a hole injection layer (HIL), a hole transport layer (HTL), an emission layer (EML), an electron transport layer (ETL), and an electron injection layer EIL). When a driving electric voltage is applied to the anode electrode and the cathode electrode, holes passing through the hole transport layer HTL and electrons passing through the electron transport layer ETL may be transferred to the emission layer EML to form excitons. As a result, the emission layer (EML) may generate visible light.

Accordingly, the OLED does not require a separate light source, and the volume and weight of the display device may be reduced. In addition, since the reaction speed of an OLED may be 1000 times faster than the reaction speed of a liquid crystal display device, there may be no afterimage when displaying an image.

Figure 3:
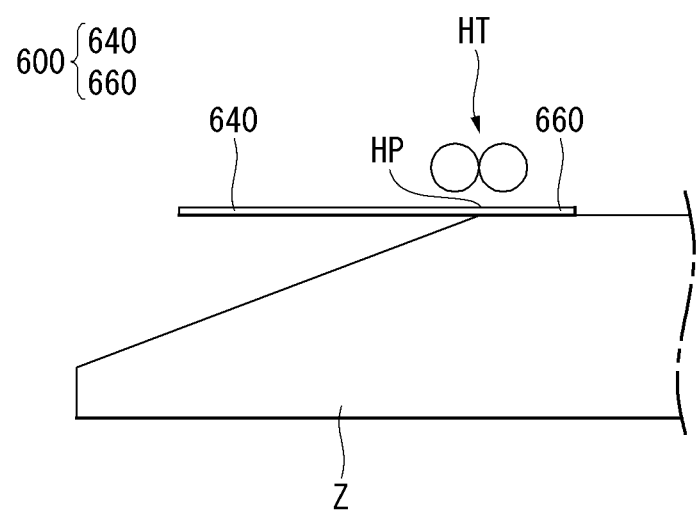
FIGS. 3 and 4 illustrate examples of a plate according to an embodiment.
Figure 4:
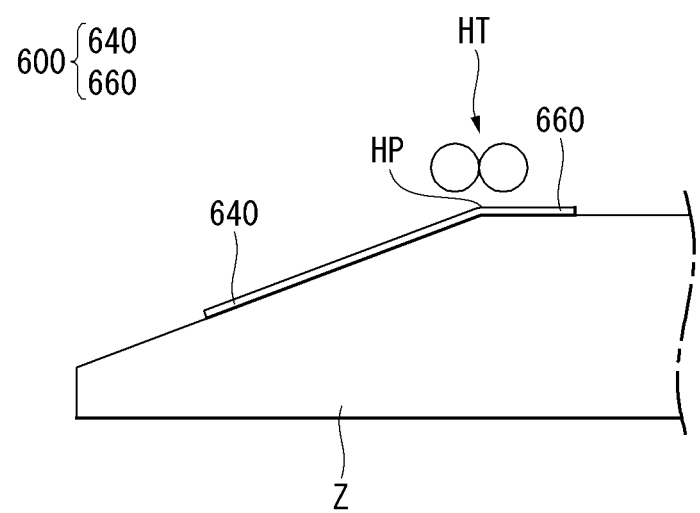

Referring to FIGS. 3 and 4, the plate 600 may be provided after a forming process. The plate 600 may be, for example, glass, tempered glass, clear plastic, or transparent reinforced plastic. Heat may be applied to the processing point of the plate 600. The plate 600 may include a first part or portion 640 and a second part or portion 660. The above-described head portion 10 may be coupled with the first part 640. The control box which will be described later may be coupled with the second part 660. The processing point of the plate 600 may be a boundary region between the first part 640 and the second part 660.

The plate 600 may be bent when heat is applied to the processing point HP of the plate 600. The plate 600 may be softened at the processing point HP when heat is applied to the processing point HP of the plate 600. The first part 640 may be angled with respect to the second part 660, by the load of the first part 640, at the processing point HP. The first part 640 may be bent until the first part 640 is supported by a metal mold Z located at the lower part.

Figure 5:
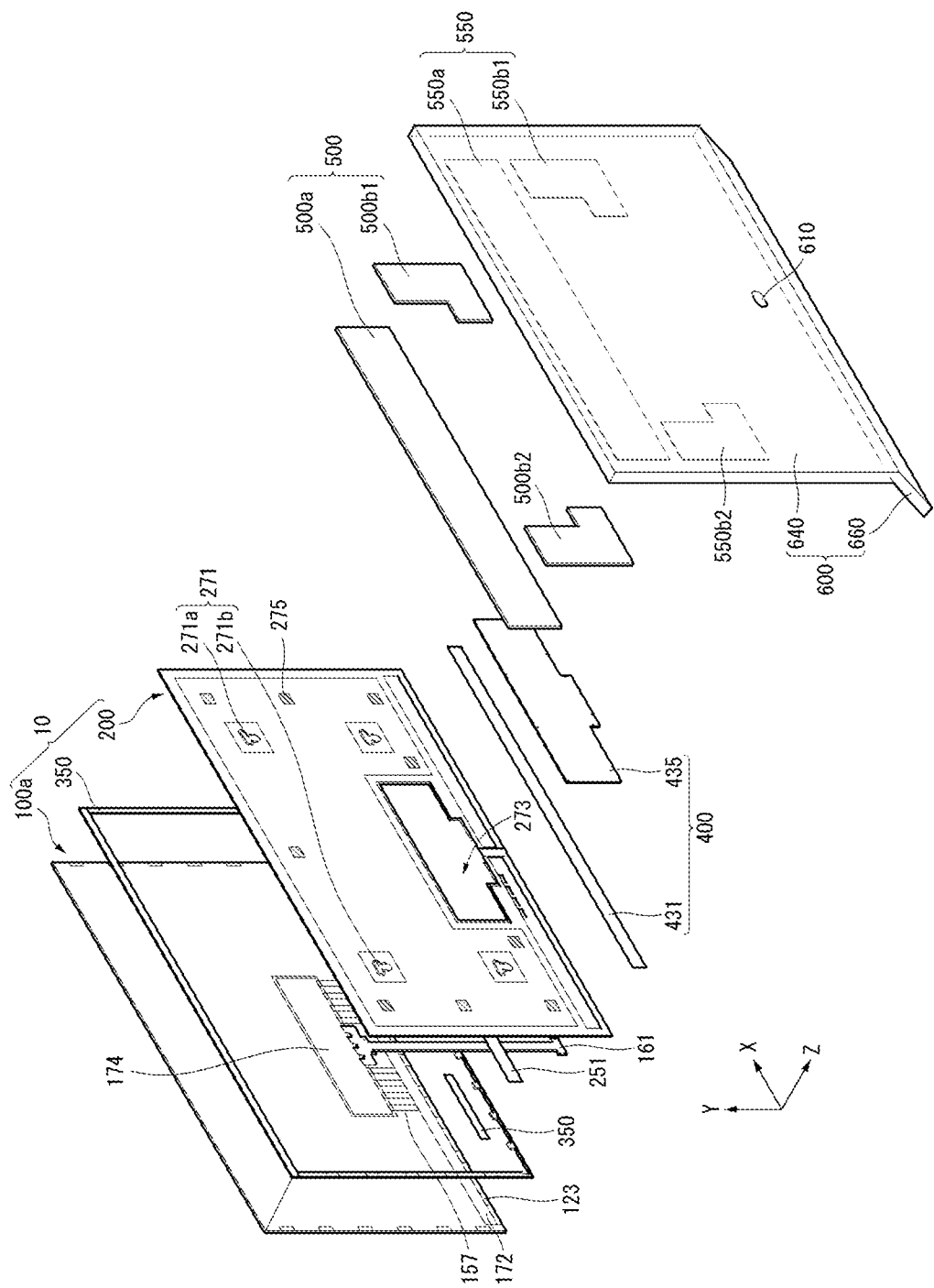
FIGS. 5 to 23 illustrate examples of the combination of the display panel and the plate according to an embodiment.

Referring to FIG. 5, the head portion 10 may include a display panel 100a, a module cover 200, and a PCB cover 400. The module cover 200 may be referred to as a frame 200. The display panel 100a may be provided at a front side of the head portion10 and may display an image. The display panel 100a may output an image by dividing the image into a plurality of pixels and controlling the color, brightness, and saturation of each pixel to emit light.

An interface PCB 174 and at least one source PCB 172 may be placed at the rear of the display panel 100a. The interface PCB 174 may be located above the source PCB 172. The source PCB 172 may be electrically connected to the interface PCB 174. Each source PCB 172 may be spaced apart from one another. At least one PCB connector 157 may be provided on the rear side of the display panel 100a. The PCB connector 157 may connect the interface PCB 174 and the source PCB 172 electrically.

The interface PCB 174 may include signal lines to transmit driving signals such as digital video data and a timing control signal transmitted from a timing controller board (T-CON board). For example, the signal lines may be a flat cable or a circular cable.

The source PCB 172 may apply an electric voltage to the display panel 100a in accordance with a signal transmitted from the interface PCB 174. That is, the source PCB 172 may apply a driving waveform to the display panel 100a in accordance with a video signal. The source PCB 172 may be electrically connected to the display panel 100a by a source COF (Chip On Film) 123. The source COF 123 connected to a side of the source PCB 172 may extend to a lower portion of the display panel 100a and may be connected to the display panel 100a.

The source COF 123 may be electrically coupled with the source PCB 172 and data pads of the display panel 100a. The source COF 123 may include a data integrated circuit. The adhesive sheet 350 may be positioned between the display panel 100a and the module cover 200. The adhesive sheet 350 may couple the display panel 100a with the module cover 200. The adhesive sheet 350 may be in the form of a rectangular frame having a hollow center. The electronic components may be accommodated in an empty space in the center of the adhesive sheet 350.

The insulating sheet 251 may be provided between the display panel 100a and the module cover 200. The insulating sheet 251 may be attached to the front surface of the module cover 200 and may be located corresponding to the source PCB 172. The insulating sheet 251 may comprise an insulating material. The insulating sheet 251 may protect the source PCB 172 from electromagnetic interference with other electronic devices.

The module cover 200 may be provided at a rear of the display panel 100a. The display panel 100a may be coupled, bonded, fixed or attached to the module cover 200 by the adhesive sheet 350. The module cover 200 may support the display panel 100a. That is, the module cover 200 may provide rigidity to the display panel 100a. The module cover 200 may be a metal. For example, the module cover 200 may include aluminum (Al).

The module cover 200 may be pressed and be bent. Accordingly, the rigidity of the module cover 200 may be improved. The thickness of the module cover 200 at the edge may be thicker than the thickness of the module cover 200 at other portions. Accordingly, when the module cover 200 is engaged with the bracket 500, the bracket 500 may be shielded by the edge portion of the bracket 500.

The fastening hole 271 may be located on the module cover 200. The fastening hole 271 may be a hole that penetrates the module cover 200. The fastening hole 271 may include a first fastening hole 271a and a second fastening hole 271b.

Referring to FIGS. 8 to 11, the bracket 500 may include a fixing pin 511. The fixing pin 511 may include a first fixing pin 511a to a fourth fixing pin 511d. The first fixing pin 511a may be positioned on either the left side or the right side of the bracket 500. The second fixing pin 511b may be located on the other of the left and right sides of the bracket 500. For example, in case that the first fixing pin 511a is positioned at the left side of the bracket 500, the second fixing pin 511b may be positioned at the right side of the bracket 500. Description of the third fixing pin 511c and the fourth fixing pin 511d can be omitted.

Referring to FIG. 5, the first and second fastening holes 271a and 271b of the module cover 200 may be positioned corresponding to the first and second fixing pins 511a and 511b respectively. The first fastening hole 271a may be located at one of the left and right sides of the module cover 200 and the second fastening hole 271b may be located on the other of the left and right sides of the module cover 200. At least one pair of fastening holes 271 may be formed on the module cover 200.

Figure 6:
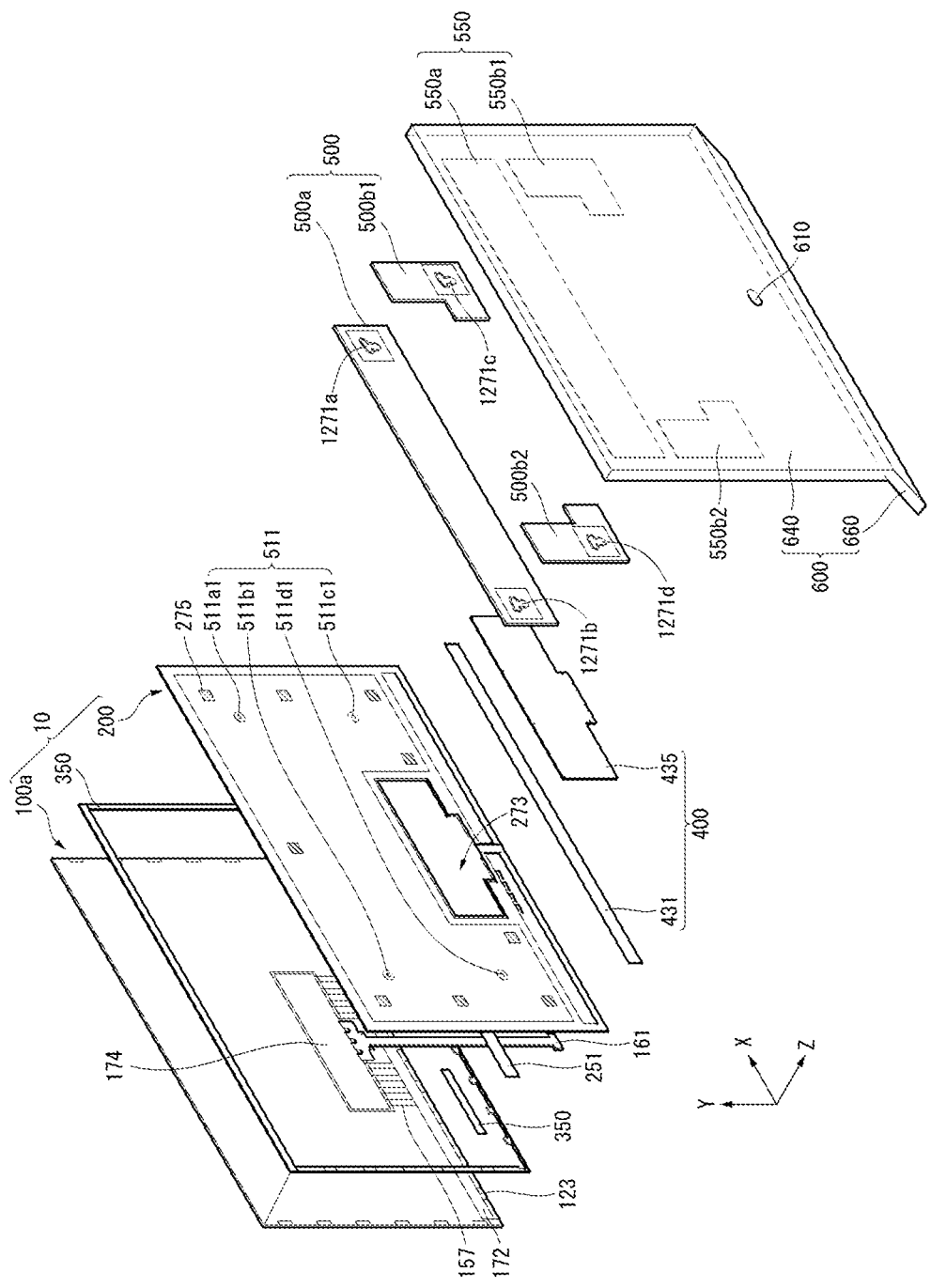

Referring to FIG. 6, the module cover 200 may include a plurality of fixing pins 511a1 to 511d1. The plurality of fixing pins 511a1 to 511d1 may include first to fourth fixing pins 511a1 to 511d1. Each of the first fixing pins 511a1 to the fourth fixing pins 511d1 may be spaced apart from each other in the horizontal direction or/and the vertical direction.

The bracket 500 may have fastening holes 1271. The fastening hole 1271 may be a hole that penetrates the bracket 500. The fastening hole 1271 may include a first fastening hole 1271a to a fourth fastening hole 1271d. The bracket 500 may include an upper bracket 500a and lower brackets 500b1 and 500b2. The first fixing pin 511a1 to the fourth fixing pin 511d1 of the module cover 200 may be inserted into the first fastening hole 1271a to the fourth fastening hole 1271d of the bracket 500, respectively.

The first fastening hole 1271a may be located on one of the left and right sides of the upper bracket 500a and the second fastening hole 1271b may be located on the other of the left and right sides of the upper bracket 500a. The third fastening hole 1271c may be located in one of the two lower brackets 500b1 and 500b2. The fourth fastening hole 1271d may be located on the other of the two lower brackets 500b1 and 500b2.

Referring to FIGS. 5 and 6, the module cover 200 may include an auxiliary coupling member 275. The auxiliary coupling member 275 may be positioned between the module cover 200 and the bracket 500. The auxiliary coupling member 275 may be located on or fixed to the rear surface of the module cover 200. The auxiliary coupling member 275 may be positioned at a constant interval in or at the edge region of the module cover 200. The auxiliary coupling member 275 may be provided on the front surface of the bracket 500.

The auxiliary coupling member 275 may comprise a magnetic material. For example, the auxiliary coupling member 275 may include a magnet. The auxiliary coupling member 275 may couple the module cover 200 with the bracket 500 by using magnetic force. Accordingly, the module cover 200 may be more firmly fixed to the bracket 500.

The module cover 200 may have an opening 273 positioned corresponding to the interface PCB 174. The opening 273 may be located at the center of the module cover 200. The opening 273 may provide a space for the interface PCB 174 to be positioned between the display panel 100a and the module cover 200.

The PCB cover 400 may include first and second PCB covers 431 and 435. The first PCB cover 431 may be located corresponding to the source PCB 172 and the second PCB cover 435 may be located corresponding to the interface PCB 174. The second PCB cover 435 may cover the opening 273.

PCB cover 400 may include an insulator such that source PCB 172 and interface PCB 174 are not subject to electromagnetic interference from other electronic devices. The PCB cover 400 may protect the source PCB 172 and the interface PCB 174 from leakage currents. For example, the PCB cover 400 may comprise a plastic material.

Figure 7:
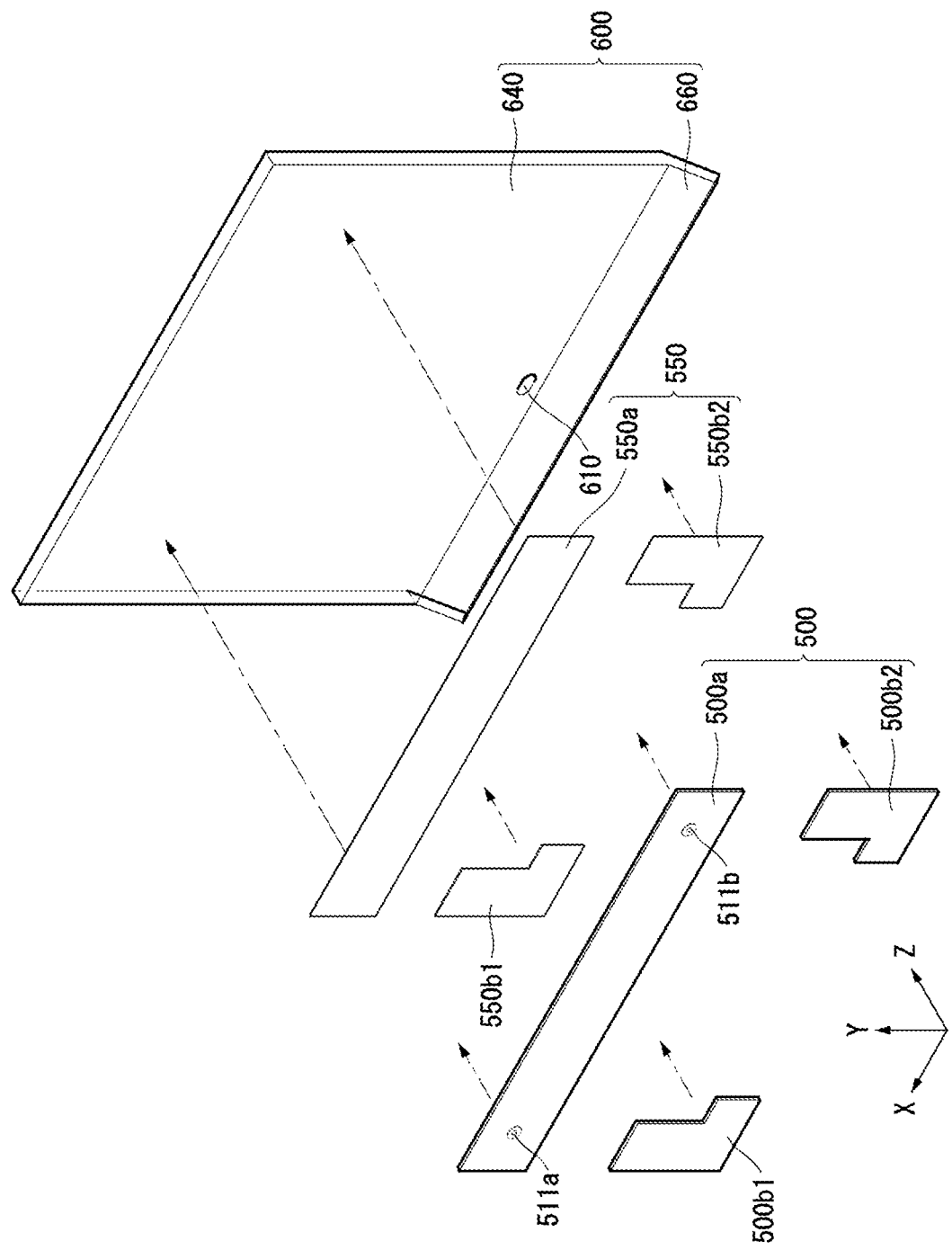
Figure 8:
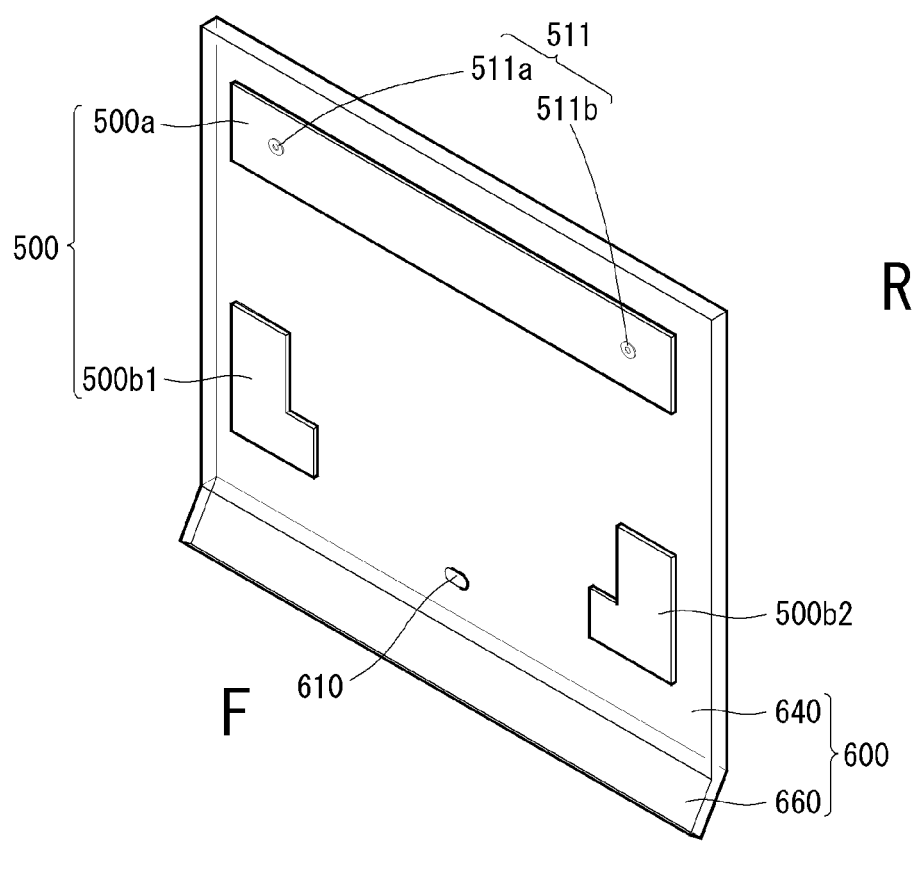
Figure 9:
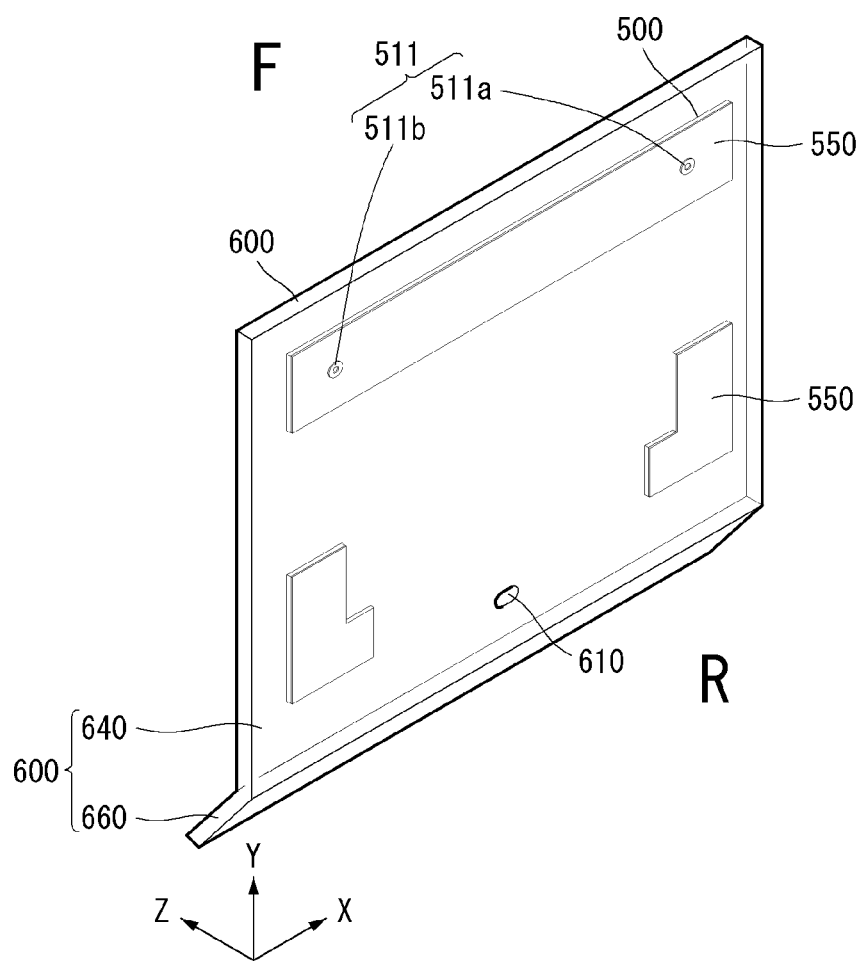

Referring to FIGS. 7 to 9, the bracket 500 may be arranged behind the display panel 100a or behind the head portion 10 (see FIGS. 5 and 6) or behind the module cover 200. The bracket 500 may be fixed to the plate 600. The plate 600 may include, for example, glass, tempered glass, clear plastic, or the like.

The bracket 500 may include an upper bracket 500a and lower brackets 500b1 and 500b2. The upper bracket 500a may be arranged long along the first long side (upper long edge) of the head portion 10. The upper bracket 500a may have a certain width.

The lower brackets 500b1 and 500b2 may be positioned adjacent to both corners at the lower side of the head portion 10 (see FIGS. 5 and 6). The lower brackets 500b1 and 500b2 may be located adjacent to the third corner C3 and the fourth corner C4 respectively. The lower brackets 500b1 and 500b2 may have, for example, a shape of 'ㄴ'.

The bracket 500 may not be separated into the upper bracket 500a and the lower bracket 500b1 and 500b2. The bracket 500 may be a rectangular frame with a hollow center. The bracket 500 may be fixed to a surface of the plate 600 by the adhesive member 550. For example, the adhesive member 550 may be a sheet or a double-sided tape or an applied adhesive.

The adhesive member 550 may have substantially the same shape as the shape of a portion of the bracket 500 attached to the plate 600. The adhesive member 550 may include an upper adhesive member 550a and a lower adhesive member 550b1 and 550b2. The upper adhesive member 550a may be positioned between the upper bracket 500a and the plate 600. The upper adhesive member 550a may be positioned corresponding to the upper bracket 500a.

The lower adhesive members 550b1 and 550b2 may be positioned between the lower brackets 500b1 and 500b2 and the plate 600. The lower adhesive members 550b1 and 550b2 may be provided at substantially the same positions as the lower brackets 500b1 and 500b2. The area of the adhesive member 550 may be substantially equal to or smaller than the area of the bracket 500.

The plate 600 may be provided behind the module cover 200 or the bracket 500. The plate 600 may be, for example, transparent or translucent or opaque glass. The plate 600 may have a certain thickness. The thickness of the plate 600 may be greater than the thickness of the head portion 10.

The plate 600 may have a line hole 610 adjacent to the lower middle region of the plate 600. The line hole 610 may pass through the plate 600 in the front-rear direction. A cable 161 may pass through the line hole 610. The cable 161 that passes through the line hole 610 may be connected to a housing 800 (see FIG. 37) described later.

Figure 10:
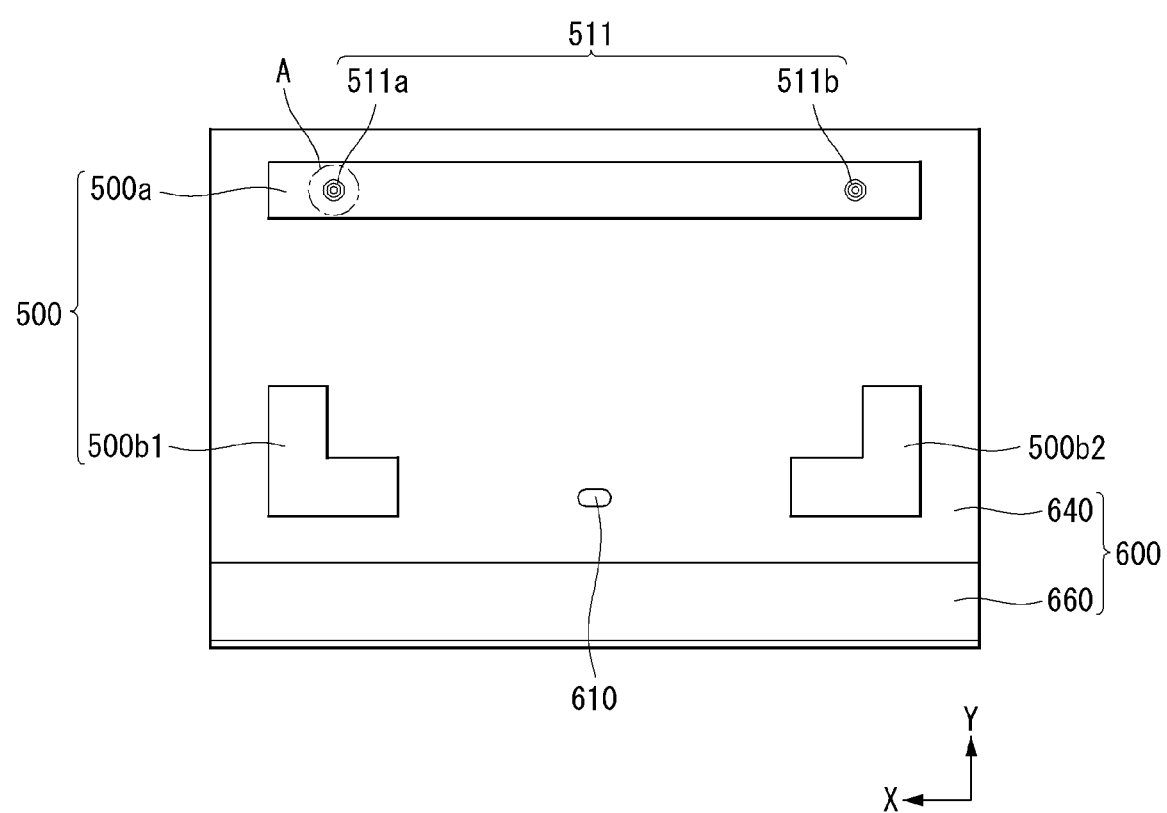
Figure 11:
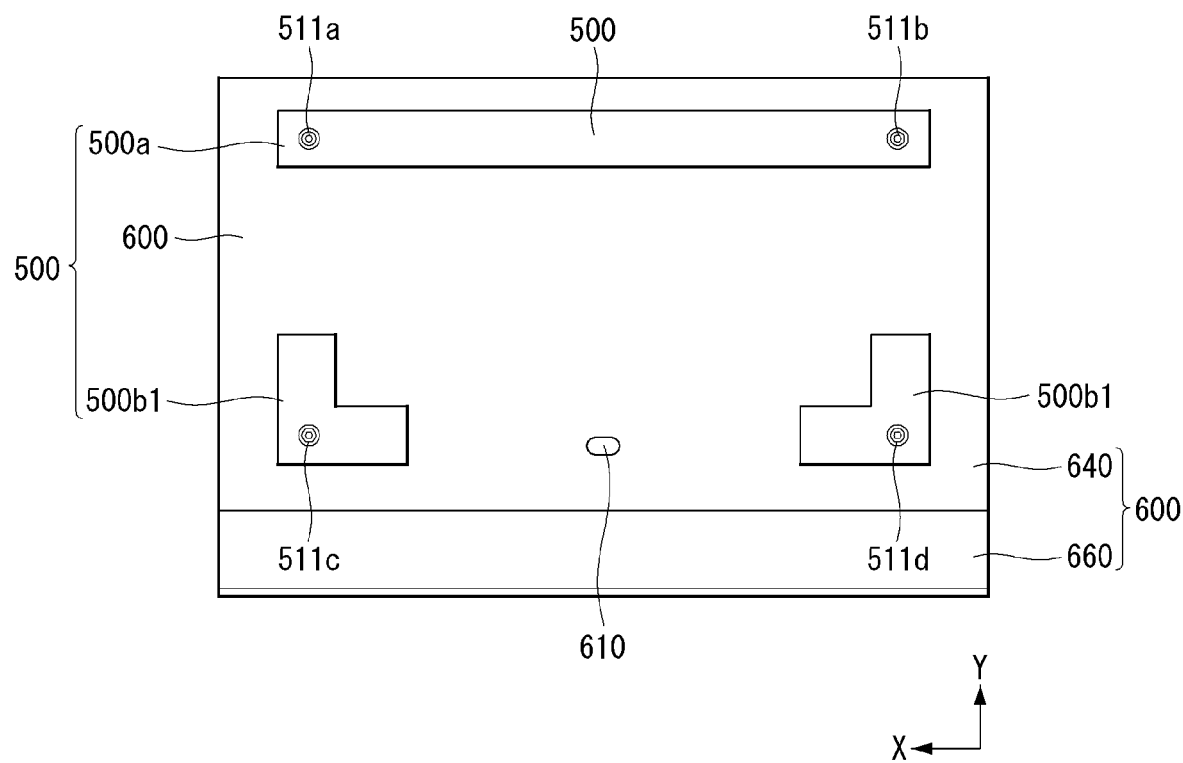

Referring to FIGS. 10 and 11, at least two fixing pins 511 may be provided on the front surface of the bracket 500. The fixing pin 511 may include a first fixing pin 511a and a second fixing pin 511b. The fixing pin 511 may include a first fixing pin 511a to a fourth fixing pin 511d.

The first fixing pin 511 a may be positioned at one of the left upper end or the right upper end of the bracket 500. The second fixing pin 511b may be positioned at the other of the left upper end and the right upper end of the bracket 500. The third fixing pin 511c may be positioned at one of the left lower end or the right lower end of the bracket 500. The fourth fixing pin 511d may be positioned at the other of the left lower end and the right lower end of the bracket 500. The first fixing pin 511a to the fourth fixing pin 511d may disperse and support the load of the head portion 10 coupled with the bracket 500.

Figure 12:
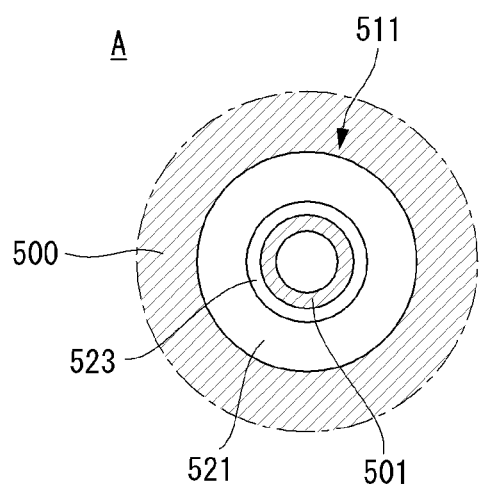
Figure 13:
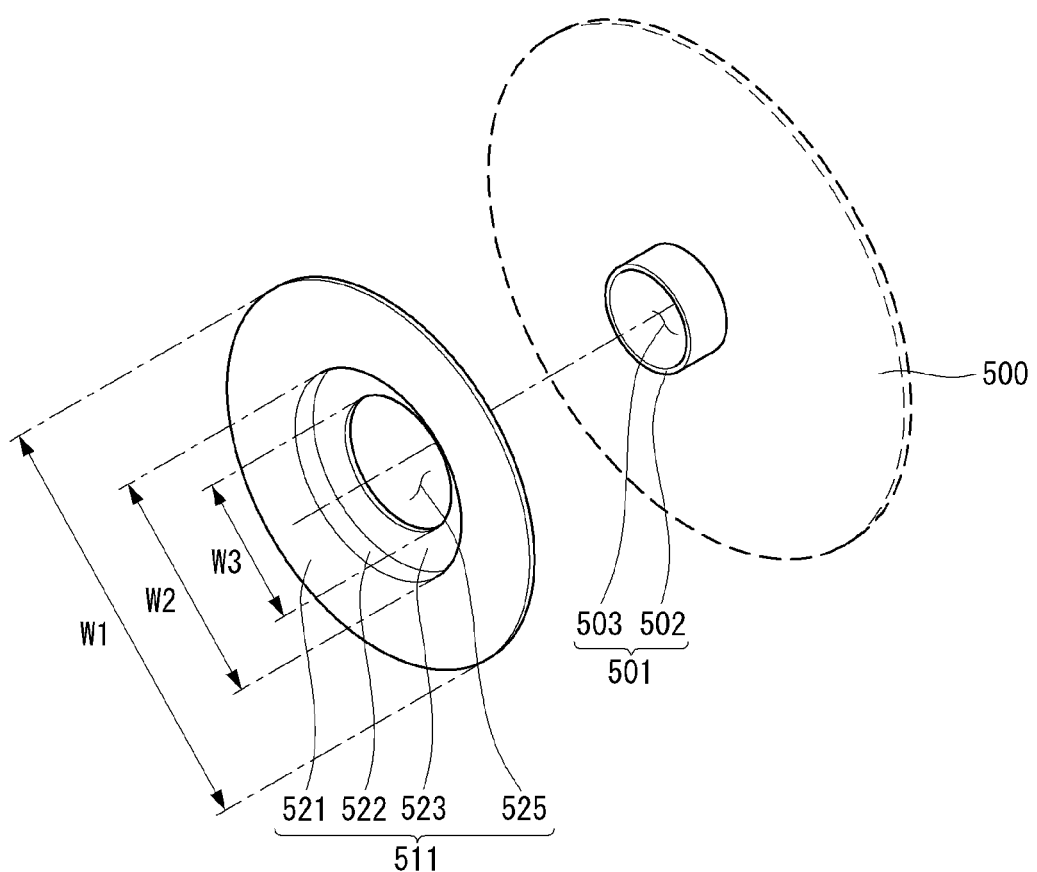
Figure 14:
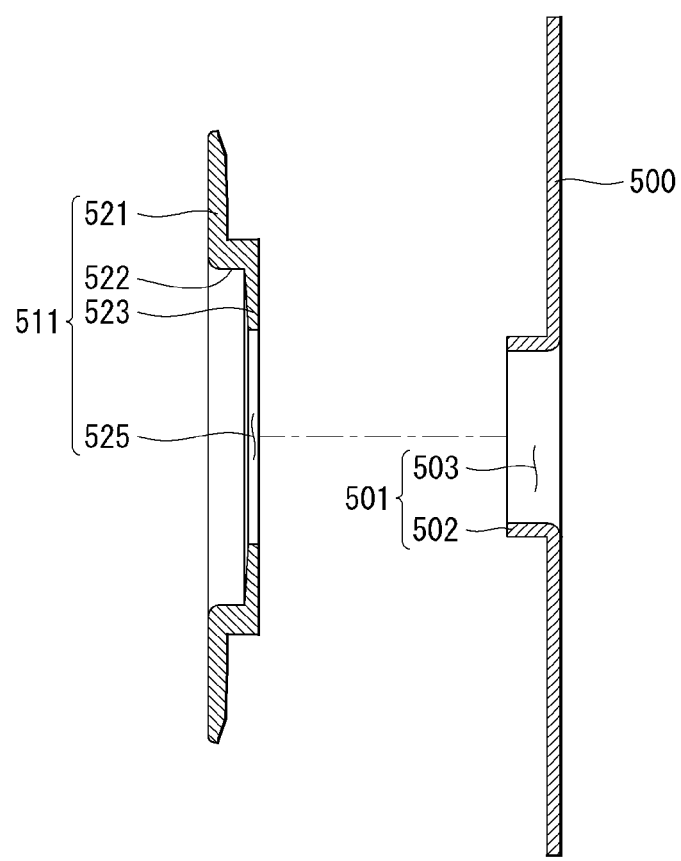
Figure 15:
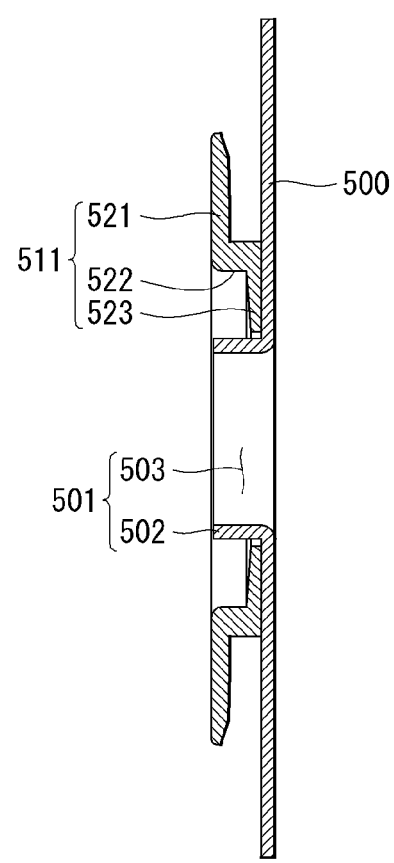
Figure 16:
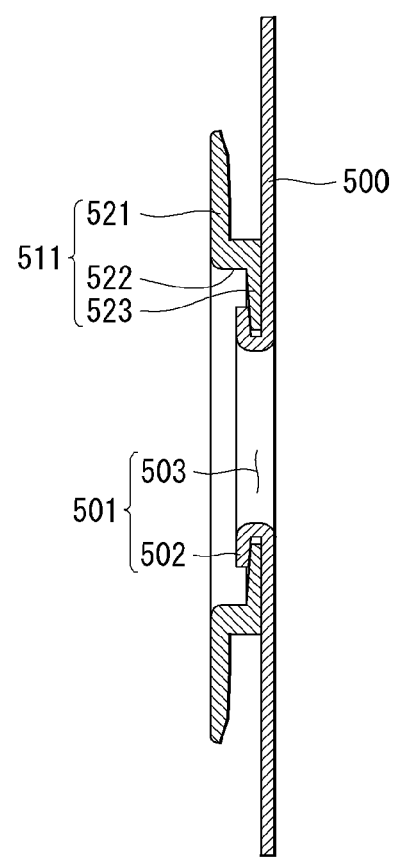
Figure 17:
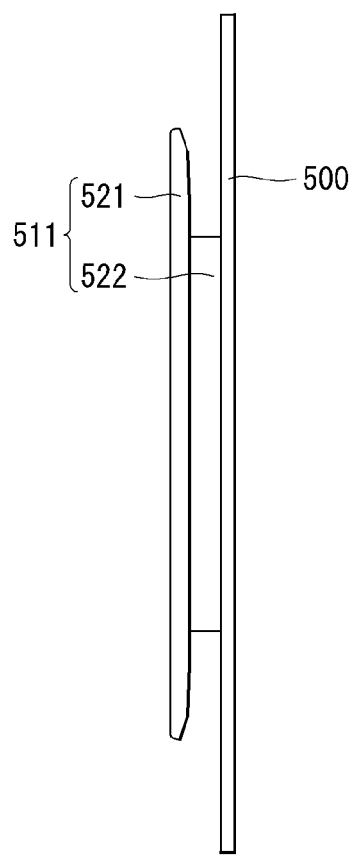

Referring to FIGS. 12 and 13, the fixing pin 511 may include a pin head 521, a pin neck 522, and a fixing hole 525. The pin head 521 may have a form of a disk having a first diameter W1. The pin neck 522 may be connected to the pin head 521. The pin neck 522 may have a form of a cylinder having a second diameter W2 smaller than the first diameter W1. The fixing pin 511 may include the pin head 521 and the pin neck 522 having different diameters, so that the fixing pin 511 may be easily fastened to the fastening hole 271 (see FIG. 5). The pin head 521 may be spaced apart from a connection portion 523. That is, the pin head 521 may be spaced forward from the connection portion 523 by the pin neck 522. The fixing pin 511 may include a fixing hole 525. The fixing hole 525 may have a third diameter W3 and the third diameter W3 may be smaller than the second diameter W2.

The fixing pin 511 may be coupled with the fixing protrusion 501 that protrudes from the bracket 500. The fixing protrusion 501 may be inserted into the fixing pin 511. The fixing pin 511 may be fixed to the bracket 500 while being riveted to the fixing protrusion 501.

Referring to FIGS. 14 to 17, the fixing pin 511 may be coupled with the fixing protrusion 501 protruded from the bracket 500. The fixing protrusion 501 may be inserted into the fixing hole 525 having the third diameter W3. The fixed protrusion 501 may have an opening 503 and a pipe wall 502.

The opening 503 may penetrate the bracket 500. The pipe wall 502 may extend or protrude toward the front of the bracket 500 from the opening 503. The pipe wall 502 may protrude toward the module cover 200 around the opening 503.

The fixing protrusion 501 may be inserted into the fixing pin 511 and then the upper end of the fixing protrusion 501 may be bent and then in close contact with the connection portion 523 of the fixing pin 511. The upper outer circumferential surface of the fixing protrusion 501 may contact the upper surface of the connection portion 523. For example, the fixing protrusion 501 may be inserted into the fixing pin 511 and then coupled with the fixing pin 511 through a caulking operation. The fixing protrusion 501 may be inserted into the fixing pin 511 and be engaged with the fixing pin 511 through a caulking operation so that no step is formed on the rear surface of the bracket 500. Accordingly, the bracket 500 may be firmly fixed to the plate 600 by using the adhesive member 550 (see FIG. 7).

Figure 18:
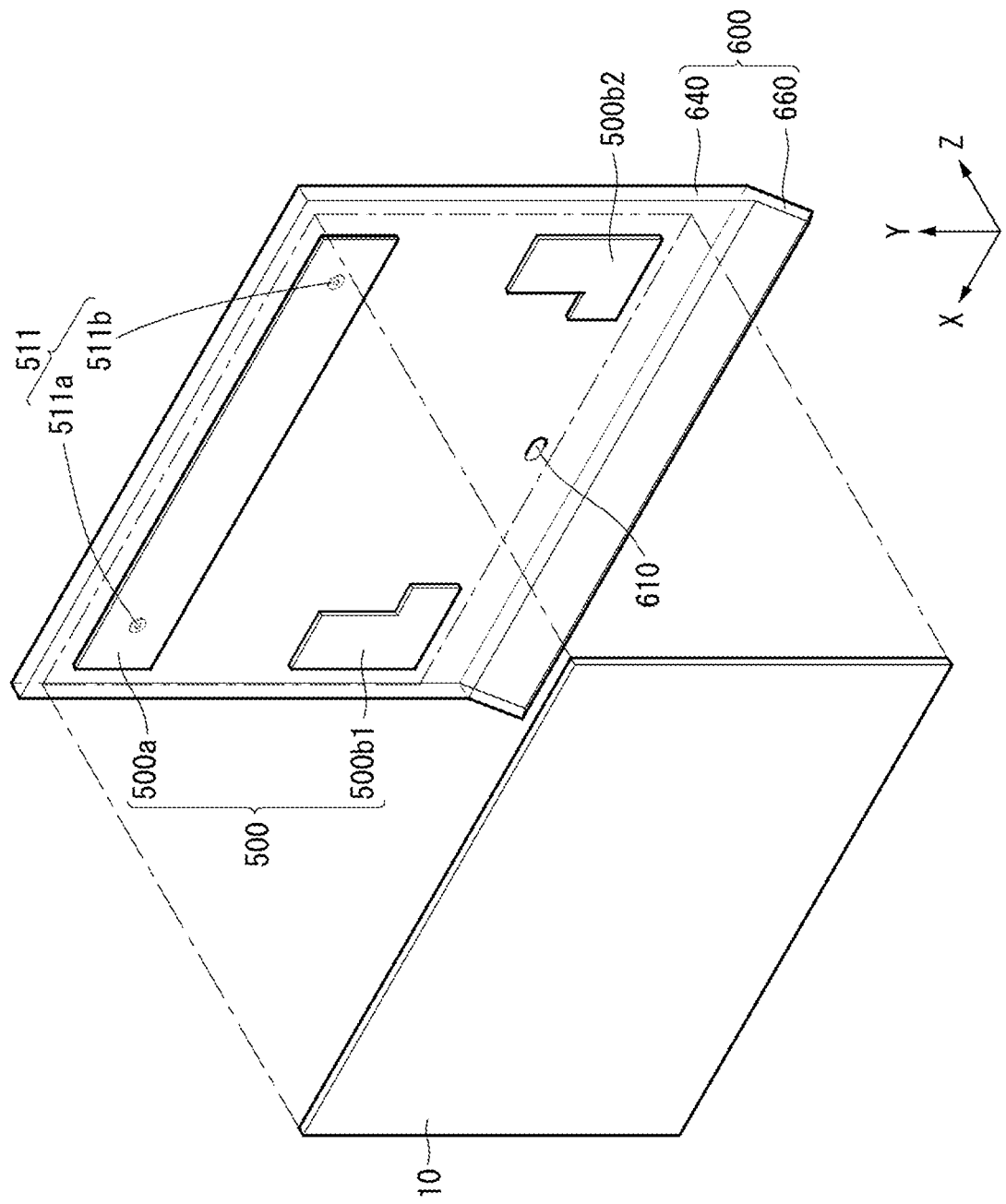
Figure 19:
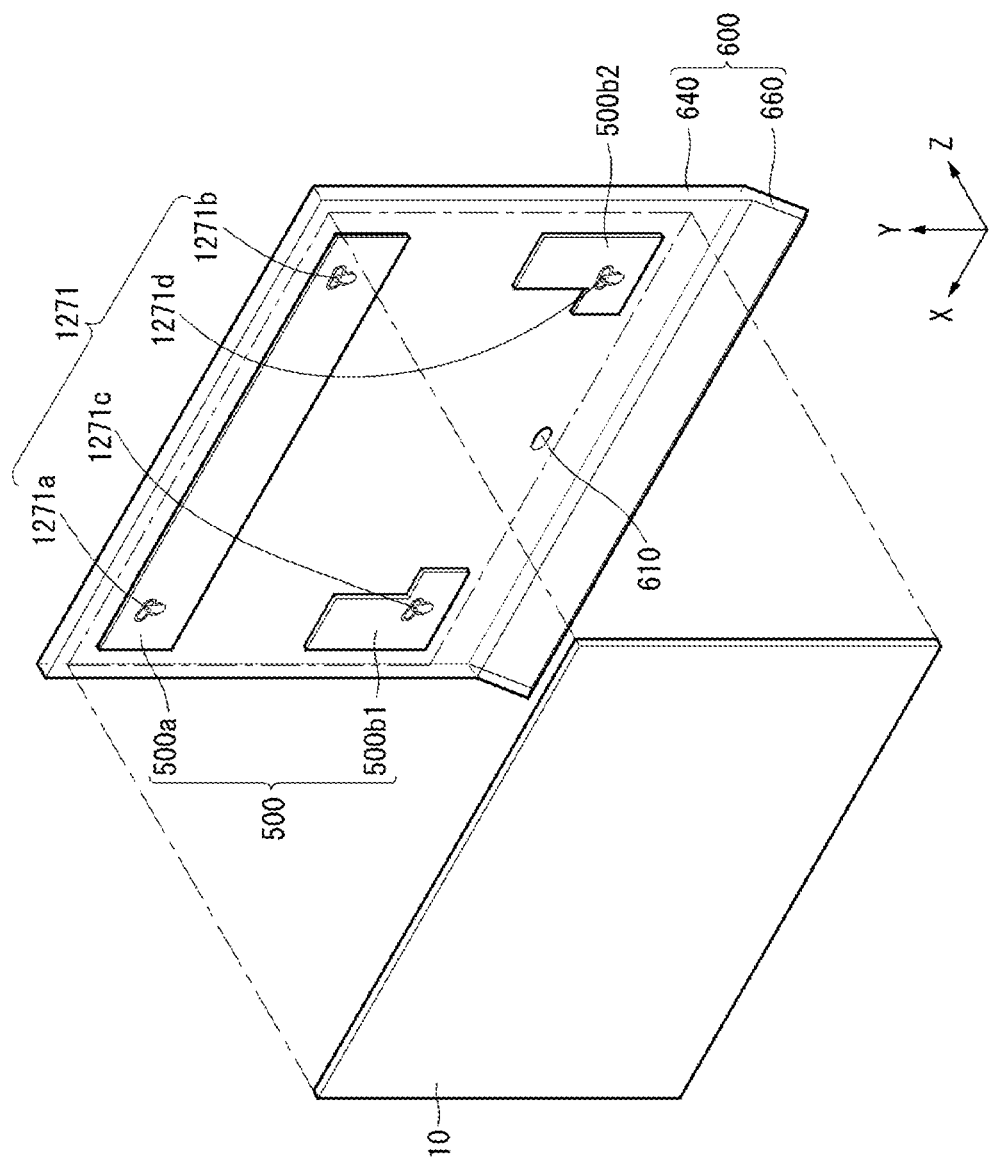

Referring to FIG. 18, the head portion 10 may be coupled with an upper bracket 500a having a first fixing pin 511a and a second fixing pin 511b. Referring to FIG. 19, the head portion 10 may be coupled with the upper bracket 500a and the lower bracket 500b. The upper bracket 500a may include first and second fastening holes 1271a and 1271b. The lower bracket 500b may include third and fourth fastening holes 1271c and 1271d.

Figure 20:
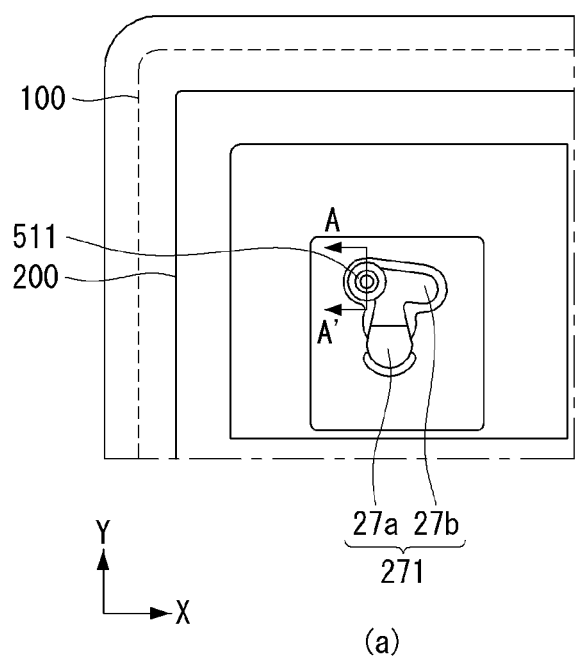
Figure 20:
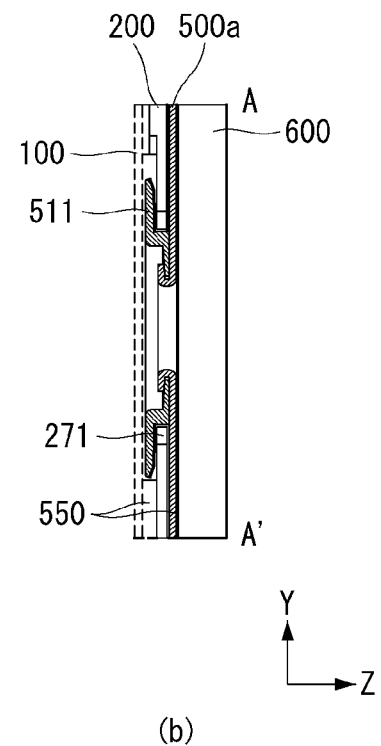
Figure 22:
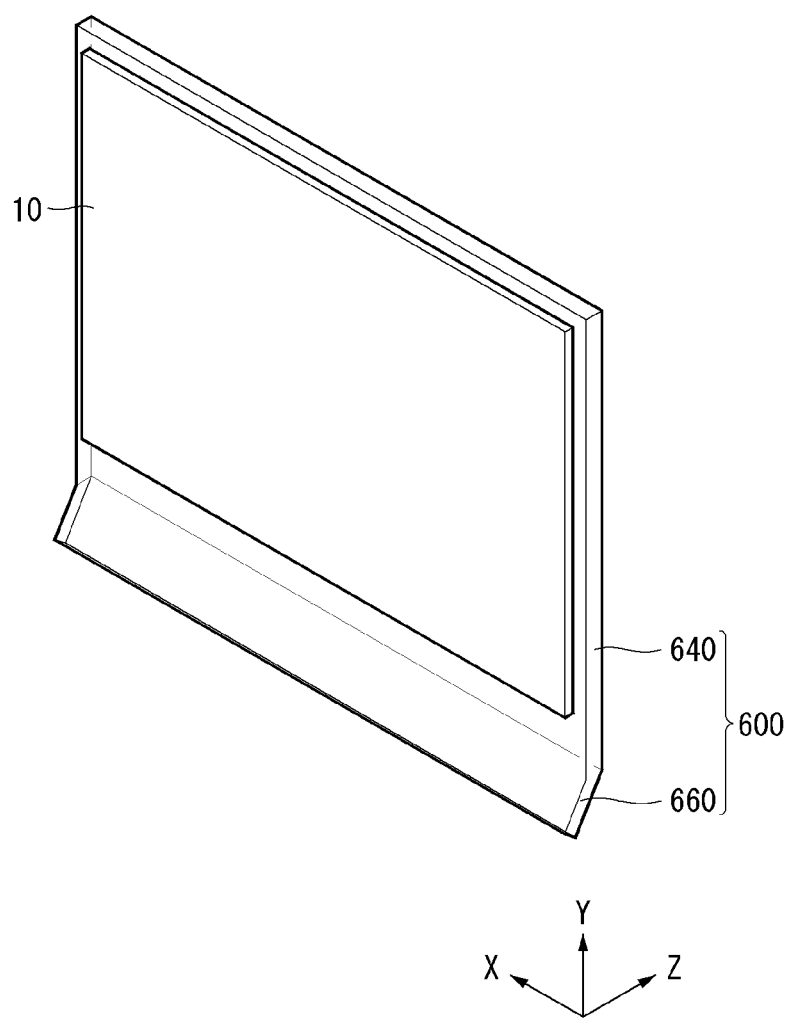

Referring to FIGS. 20 and 22, the first fixing pin 511a may be coupled with the first fastening hole 271a provided in the module cover 200. FIG. 20 (a) illustrates the first fastening hole 271a and the first fixing pin 511a as a front view of the display device assuming that the display panel 100a disposed in front of the module cover 200 is transparent. FIG. 20 (b) shows a cross section taken along the line A-A' as an example. The first fastening hole 271a may include a lead-in region 27a through which the first fixing pin 511a is drawn in or drawn out, and a seating region 27b on which the first fixing pin 511a is seated. The lead-in region 27a may be disposed at a lower portion of the first fastening hole 271a and may have a sufficient hole area or diameter to allow both the pin head 521 and the pin neck 523 to be drawn in and drawn out. That is, the lead-in region 27a may have a hole area or diameter larger than the first diameter W1 of the pin head 521.

The seating region 27b may guide the first fixing pin 511a drawn in through the lead-in region 27a and fasten the first fixing pin 511a. The seating region 27b may be located at the upper portion of the first fastening hole 271a. The seating region 27b may have a width smaller than the first diameter W1 of the pin head 521. The pin head 521 may be restricted from being drawn in and out from the first fastening hole 271a at the seating area 27b.

The first fixing pin 511a may move along the first fastening hole 271a and may be seated in the first fastening hole 271a. The seating region 27b may have a width greater than the second diameter W2 of the pin neck 522. The first fixing pin 511a that is seated in the seating region 27b may maintain the current state unless an external force equal to or greater than a certain value is provided. As long as a certain external force is not provided, the first fixing pin 511a may be fixed to the seating region 27b.

In other words, when a certain external force is applied, the module cover 200 may be tilted or shifted in a direction, and the first fixing pin 511a may move along the fastening hole 271 relatively. The relative movement of the first fixing pin 511a may be guided along the shape of the seating region 27b of the first fastening hole 271a. The expression of "the fixing pin 511 moves relatively" may mean that the first fixing pin 511a looks fixed with respect to the bracket 500 but looks moving with respect to the first fastening hole 271a.

This may prevent the first fixing pin 511a that is seated in the seating region 27b from being displaced from the first fastening hole 271a by the external force unintentionally provided to the lead-in region 27a. The fixing pin 511 and the fastening hole 271, the first fixing pin 511a and the first fastening hole 271a, or the second fixing pin 511b and the second fastening hole 271b may be referred to as a coupling unit. The coupling unit may be located between the module cover 200 and the bracket 500.

Figure 21:
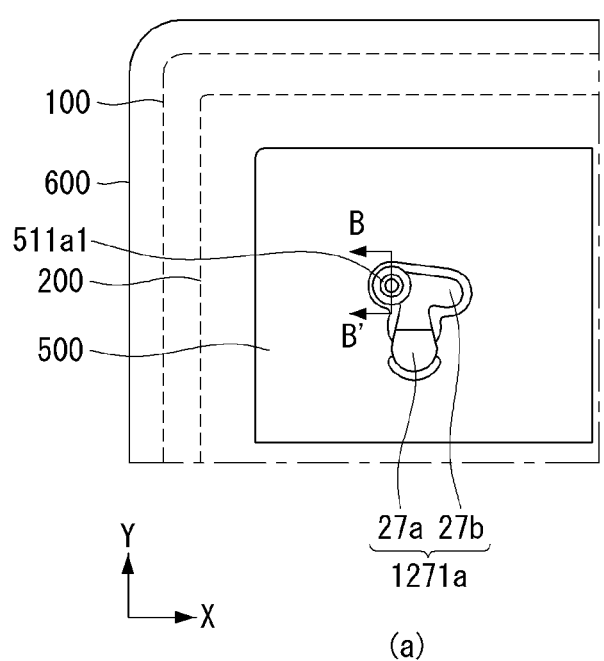
Figure 21:
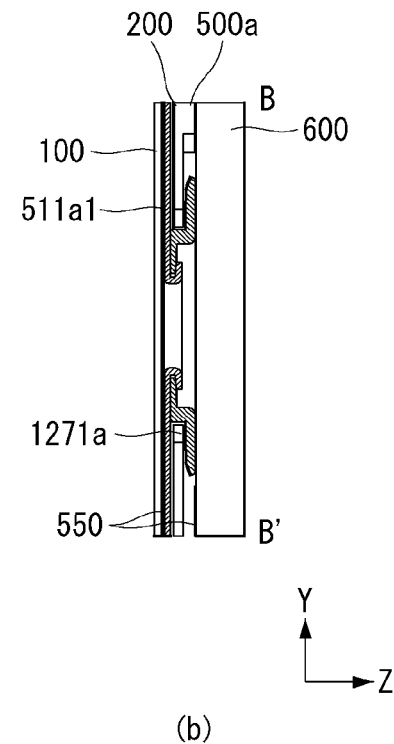

Referring to FIGS. 21 and 22, a first fixing pin 511a1 may be inserted into the first fastening hole 1271a provided at the bracket 500. FIG. 21 (a) illustrates the first fastening hole 1271a and the first fixing pin 511a1 as a rear view of the display device assuming that the plate 600 provided behind the bracket 500 is transparent. FIG. 21 (b) shows a cross section taken along the line B-B' as an example.

Figure 23:
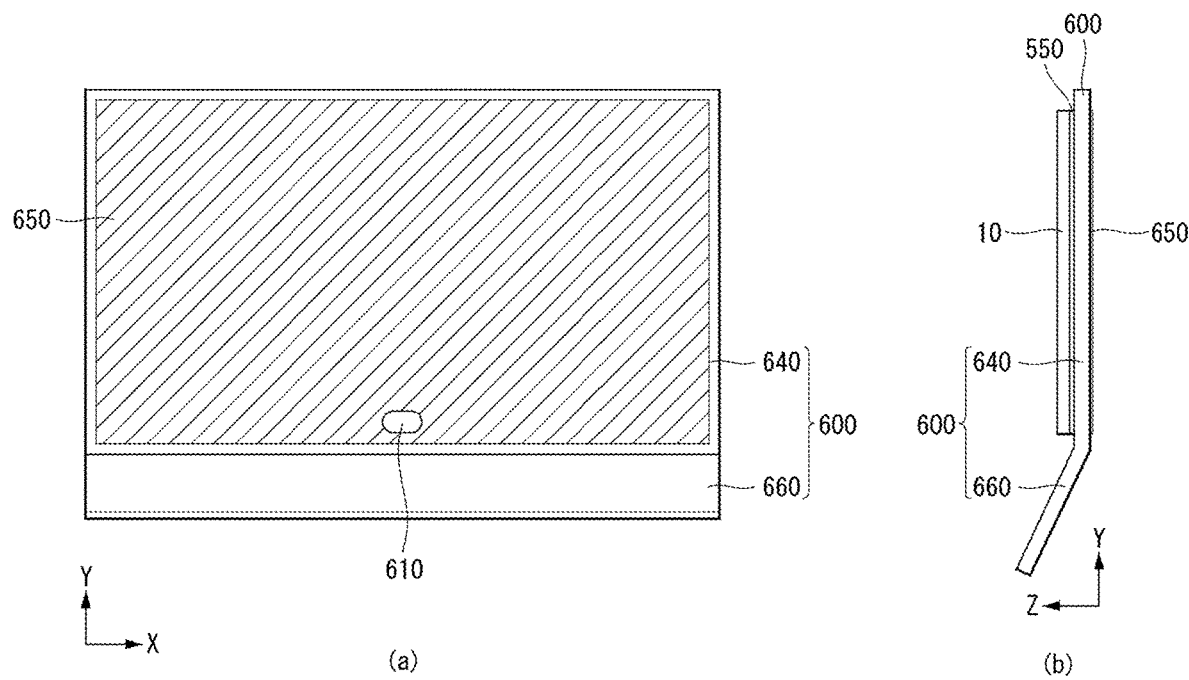

Referring to FIG. 23, the reinforcing film 650 may be positioned on the rear surface of the plate 600. The reinforcing film 650 may protect the plate 600 and may complement the rigidity of the plate 600. For example, when the plate is formed of glass or includes glass, the reinforcing film 650 may reinforce the brittleness of the plate 600.

The reinforcing film 650 may comprise an opaque material. The reinforcing film 650 may block light that can be transmitted to the front of the plate 600 through the rear of the plate 600.

Figure 24:
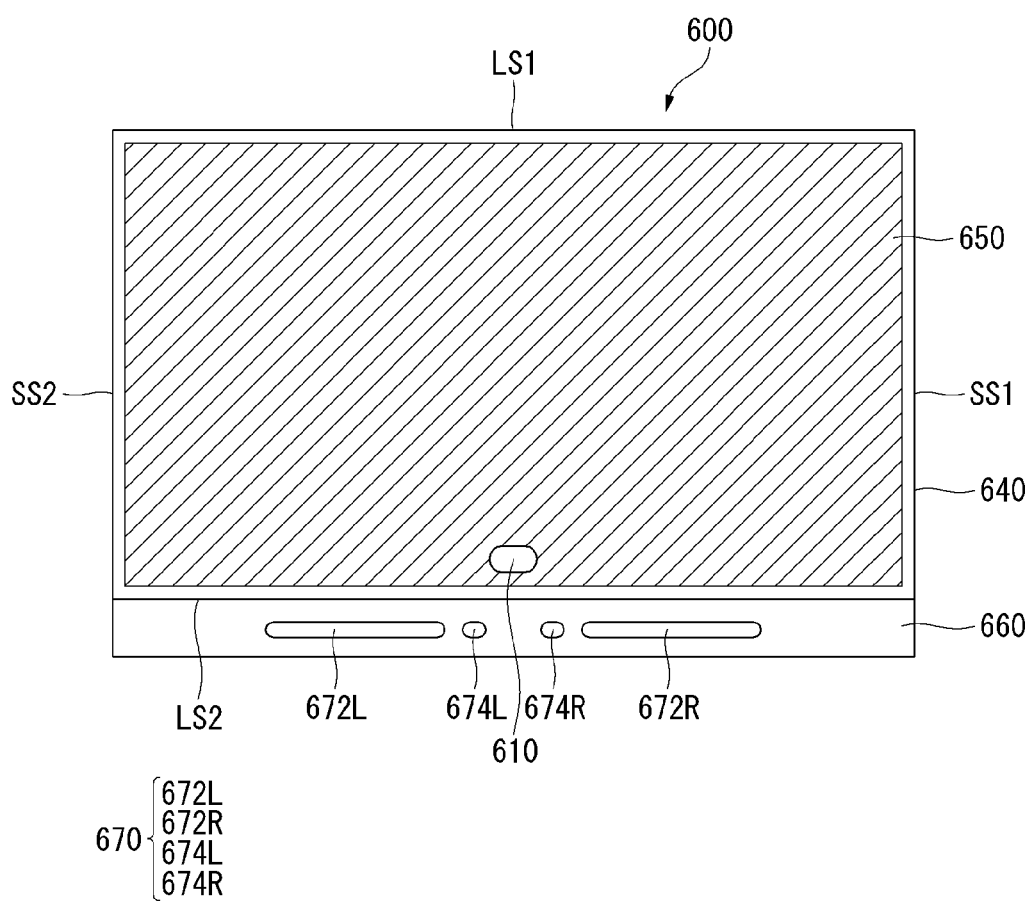
FIGS. 24 to 31 illustrate examples of the structure of a plate according to an embodiment.

Referring to FIG. 24, the plate 600 may include a line hole 610. The line hole 610 may be formed in the first part 640. The line hole 610 may be located adjacent to a middle point of the lower side (second long side LS2) of the first part 640 of the plate 600. The plate 600 may have coupling holes 670. The coupling holes 670 may include a first coupling hole 672L to a fourth coupling hole 674R. The first coupling hole 672L and/or the second coupling hole 672R may be elongated. The third coupling hole 674L and/or the fourth coupling hole 674R may be relatively shorter than the first coupling hole 672L and/or the second coupling hole 672R. The coupling hole 672L, 672R, 674L, and 674R can be referred to as an opening 672L, 672R, 674L, and 674R.

The first coupling hole 672L may be formed in the second part 660 of the plate 600 and may be elongated along the lower side (second long side LS2) of the first part 640. For example, the first coupling hole 672L may be parallel to the lower side (second long side LS2) of the first part 640. The third coupling hole 674L may be positioned adjacent to the first coupling hole 672L. The second coupling hole 672R may be symmetrical with the first coupling hole 672L and the fourth coupling hole 674R may be symmetrical with the third coupling hole 674L. The third coupling hole 674L and the fourth coupling hole 674R may be positioned between the first coupling hole 672L and the second coupling hole 672R.

Figure 25:
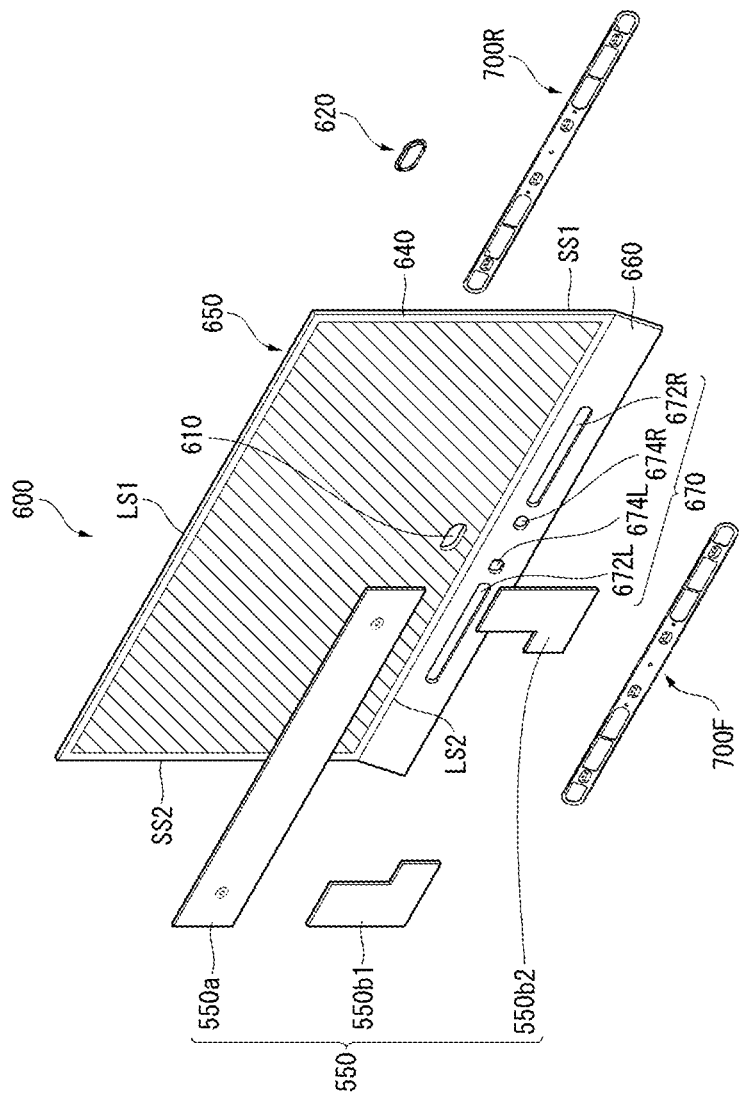

Referring to FIG. 25, the front bracket 700F may be positioned at a front of the second part 660 of the plate 600. The front bracket 700F may be extended along the lower side (second long side LS2) of the first part 640 of the plate 600. The front bracket 700F may be placed alongside of the lower side (second long side LS2) of the first part 640 of the plate 600. The front bracket 700F may face the coupling holes 670 or may be positioned corresponding to the coupling holes 670.

The rear bracket 700R may be located at a rear of the second part 660 of the plate 600. The rear bracket 700R may extend along the lower side LS2 of the first part 640 of the plate 600. The rear bracket 700R may be placed alongside of the lower side LS2 of the first part 640 of the plate 600. The rear bracket 700R may face the coupling holes 670 or may be positioned corresponding to the coupling holes 670. The rear bracket 700R may be positioned opposite to the front bracket 700F with reference to the plate 600.

The front bracket 700F may be referred to as a first bracket 700F and the rear bracket 700R may be referred to as a second bracket 700R. The line ring 620 may be inserted into the line hole 610.

Figure 26:
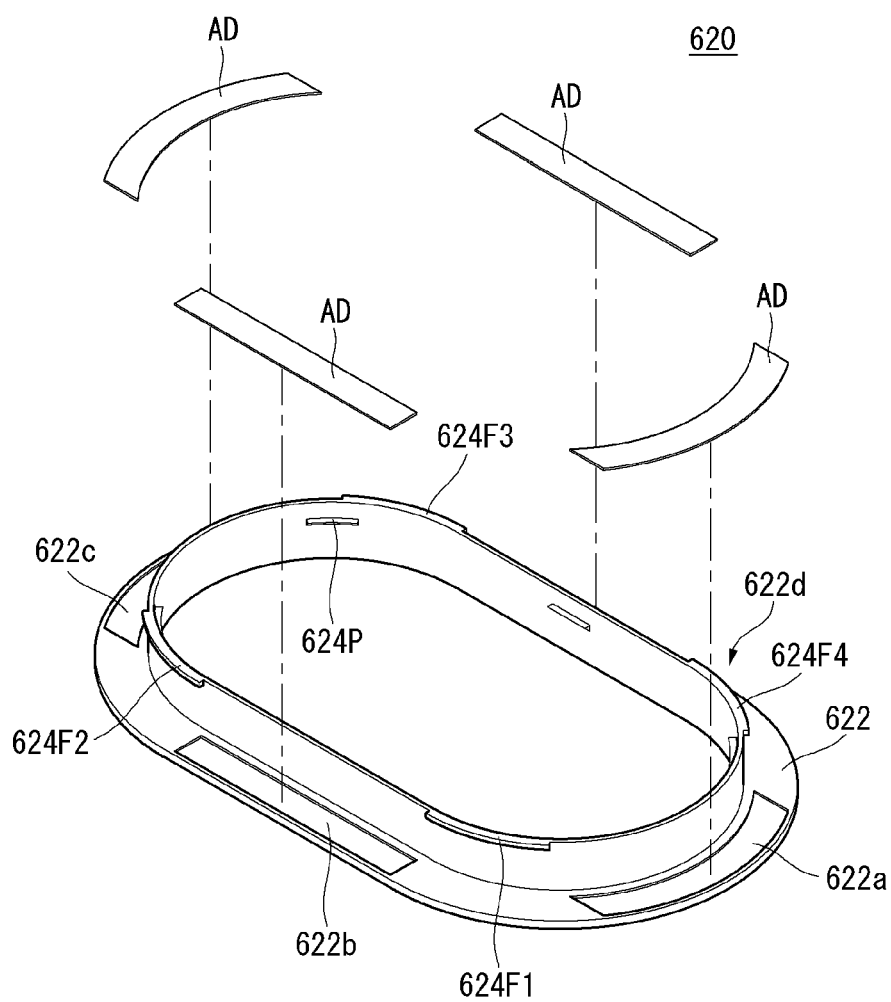

Referring to FIG. 26, the line ring 620 may have a shape of an ellipse as a whole. The line ring 620 may have a ring plate 622 and a ring wall 624F1 to 624F4. The ring plate 622 may be elongated in a circular or oval shape and may form a closed curve. The ring plate 622 can be in contact with the rear surface of the plate 600.

The ring wall 624F1 to 624F4 may be elongated in a circular or elliptical shape, and may form a closed curve. The ring wall 624F1 to 624F4 may contact the inner surface of the line hole 610. The ring wall 624F1 to 624F4 may be connected to the inner circumferential surface of the ring plate 622. The outer circumferential surface of the ring wall 624F1 to 624F4 may be connected to the inner circumferential surface of the ring plate 622.

The junction portion 622a to 622d may be formed on the ring plate 622. The junction portions 622a to 622d may be recessed from the outer surface of the ring plate 622 or may form a step. For example, the junction portions 622a to 622d may be recessed to form a step at the front surface of the ring plate 622. The junction portions 622a to 622d may be formed continuously to form a closed loop, or may be formed discontinuously to form an open loop.

A bonding member AD may be located at the junction portions 622a to 622d. For example, the bonding member AD may be a double-sided tape. The line ring 620 or the ring plate 622 may be fixed to the rear surface of the plate 600 or the second part 660 of the plate 600 by the bonding member AD.

A projection 624P may be formed on the inner circumferential surface of the ring wall 624F1 to 624F4. A plurality of projections 624P may be formed on the inner circumferential surface of the ring wall 624F1 to 624F4. The projections 624P may be arranged at regular spacing from each other. The spacing may be regular or irregular.

Figure 27:
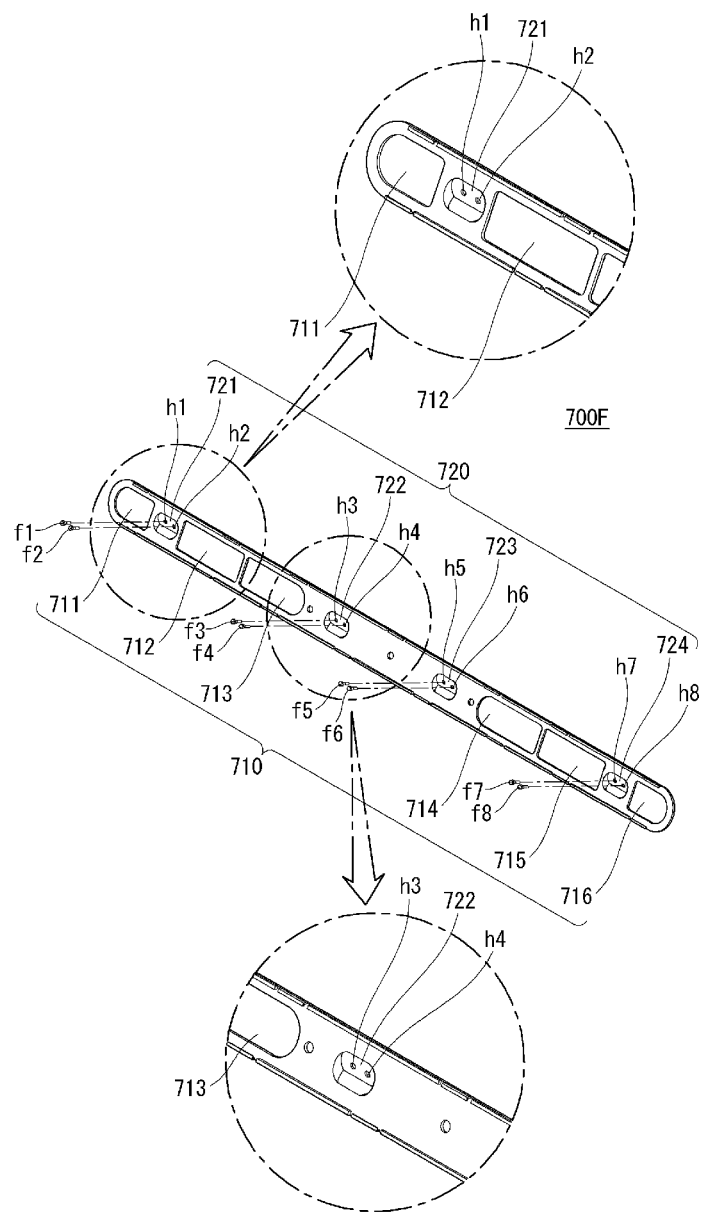

Referring to FIG. 27, the front bracket 700F may include an opening 710 and a recessed portion 720. The opening 710 may include the first opening 711 to the sixth opening 716. When the front bracket 700F is placed in the front of the second part 660 of the plate 600 (see FIG. 25), the first to third openings 711 to 713 may be located corresponding to the first coupling hole 672L (see FIG. 24), and the fourth to sixth openings 714 to 716 may be located corresponding to the second coupling hole 672R (see FIG. 24). The shape of the second to seventh openings 712 to 715 may correspond to the shape of the front surface of the speaker unit which will be described later.

The recessed portion 720 may include a first recessed portion 721 to a fourth recessed portion 724. The recessed portion 720 may protrude toward the rear of the front bracket 700F. The recessed portion 720 may be recessed from the front surface of the front bracket 700F and may protrude from the rear surface. The first recessed portion 721 may be located between the first opening 711 and the second opening 712. The second recessed portion 722 may be located adjacent to the third opening 713. The third recessed portion 723 may be located adjacent to the fourth opening 714. The fourth recessed portion 724 may be located between the fifth opening 715 and the sixth opening 716. The recessed portion 720 may include holes h1 to h8. The hole h may include a plurality of holes h1 to h8. The fastening members f1 to f8 may be inserted into the holes h1 to h8 or may pass through the holes h1 to h8.

Figure 28A:
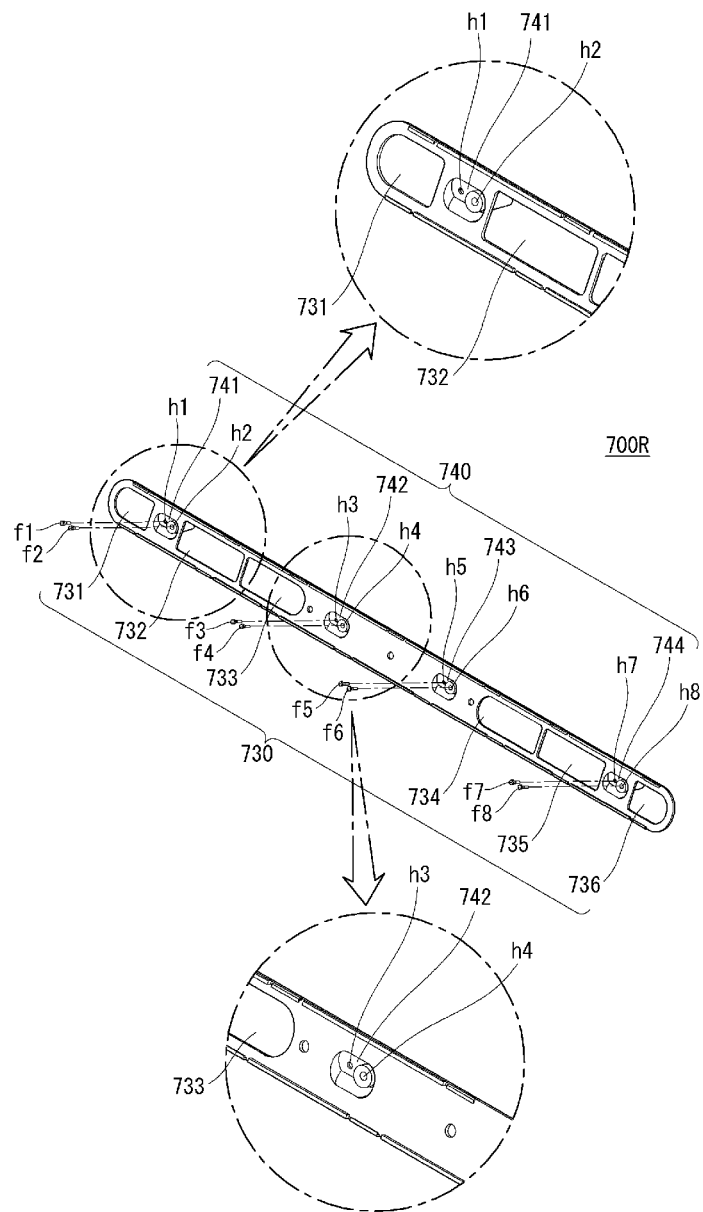
Figure 28B:
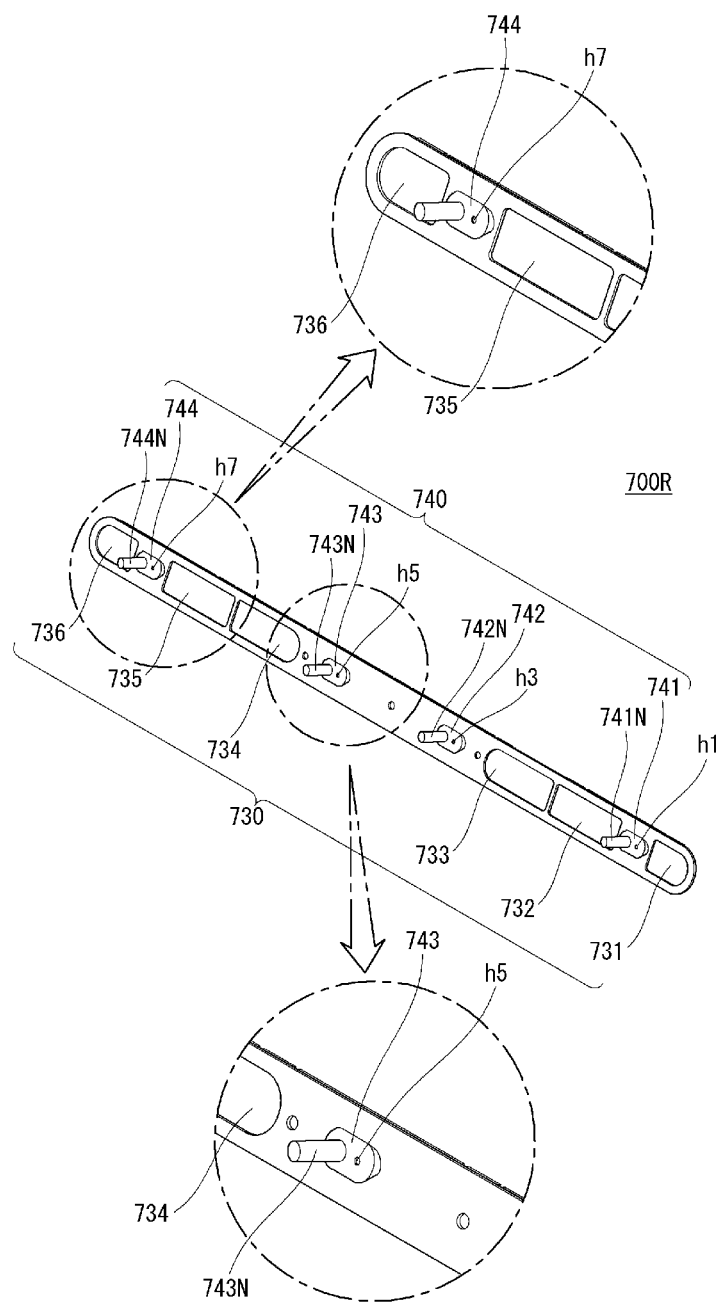

Referring to FIGS. 28A and 28B, the rear bracket 700R may include an opening 730 and a recessed portion 740. The opening 730 may include the first opening 731 to the sixth opening 736. When the rear bracket 700R is placed in the rear of the second part 660 of the plate 600 (see FIG. 25), the first to third openings 731 to 733 may be located corresponding to the first coupling hole 672L (see FIG. 24), and the fourth to sixth openings 714 to 716 may be located corresponding to the second coupling hole 672R (see FIG. 24). The shape of the second to seventh openings 732 to 735 may correspond to the shape of the front surface of the speaker unit which will be described later.

The recessed portion 740 may include a first recessed portion 741 to a fourth recessed portion 744. The recessed portion 740 may protrude toward the rear of the rear bracket 700R. The recessed portion 740 may be recessed from the front surface of the rear bracket 700R and may protrude from the rear surface. The first recessed portion 741 may be located between the first opening 731 and the second opening 732.

The second recessed portion 742 may be located adjacent to the third opening 733. The third recessed portion 743 may be located adjacent to the fourth opening 734. The fourth recessed portion 744 may be located between the fifth opening 735 and the sixth opening 736. The recessed portion 740 may include holes h1 to h8.

The hole h may include a plurality of holes h1 to h8. The fastening members f1 to f8 may be inserted into the holes h1 to h8 or may pass through the holes h1 to h8.

Figure 29:
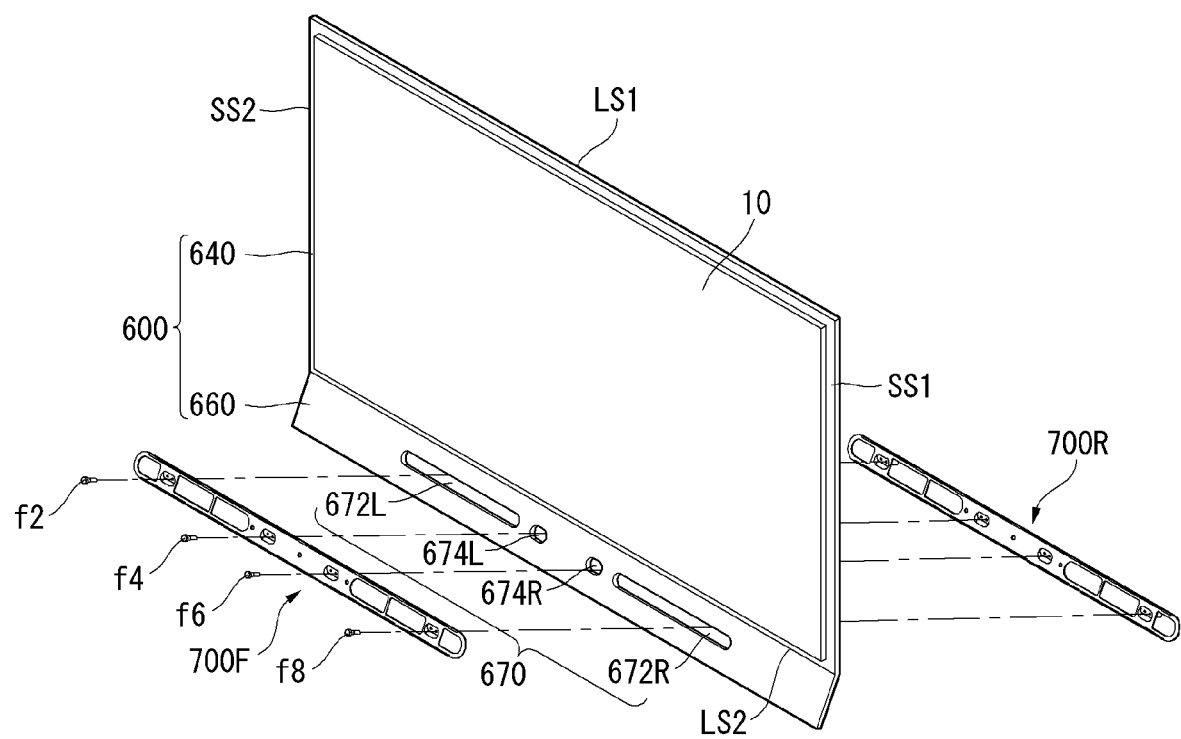
Figure 30:
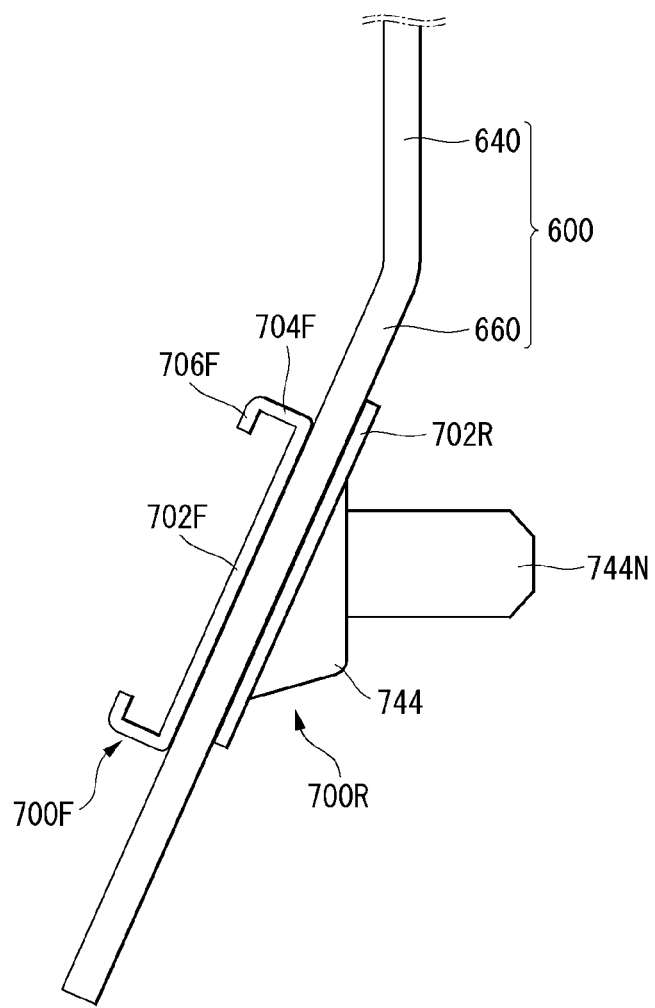
Figure 31:
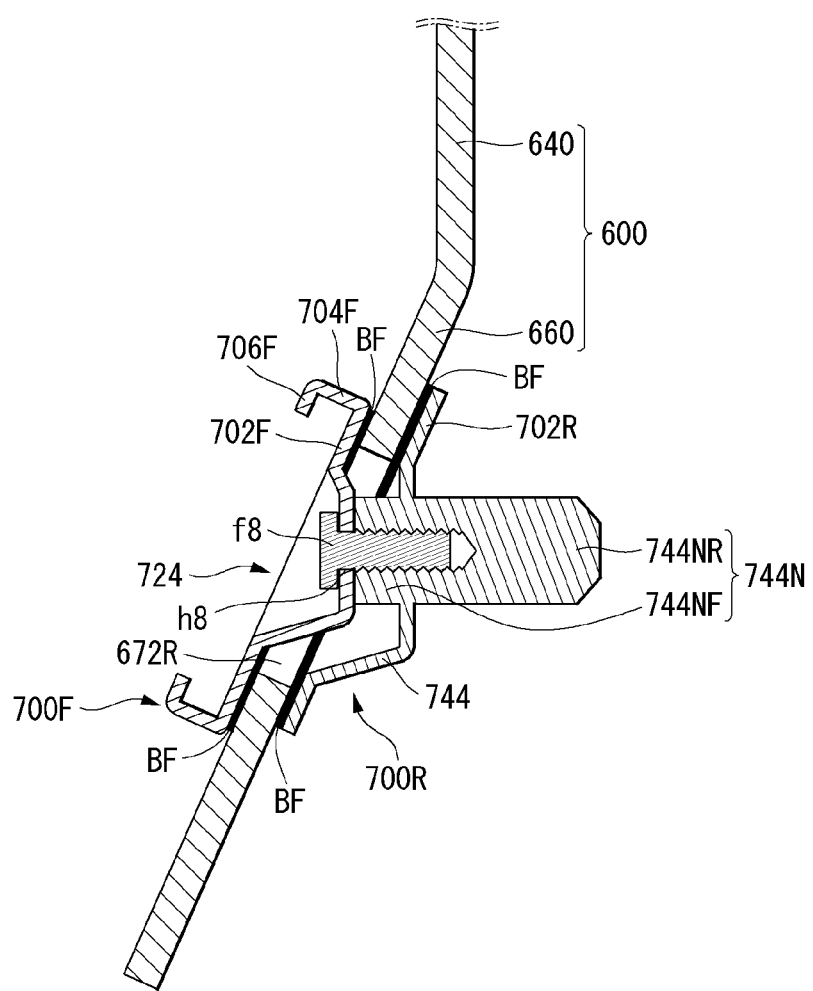

Referring to FIGS. 29 to 31, the second part 660 of the plate 600 may be positioned between the front bracket 700F and the rear bracket 700R, or may be fixed between the front bracket 700F and the rear bracket 700R, or may be pressed by the front bracket 700F and the rear bracket 700R. The front bracket 700F may have a fixed portion 702F, a side wall 704F, and a flange 706F. The fixed portion 702F may be located on the front surface of second part 660 of plate 600 or may contact the front surface of second portion 660. A buffer layer BF may be positioned between the fixed portion 702F of the front bracket 700F and the front surface of the second part 660 of the plate 600.

The buffer layer BF may be, for example, a synthetic resin or a double-sided tape. The buffer layer BF may strengthen the bonding force between the front bracket 700F, the rear bracket 700R and the plate 600, and may prevent the plate 600 from damage. The side wall 704F and/or the flange 706F may reinforce the rigidity of the front bracket 700F. The speaker cover which will be described later may be coupled to the side wall 704F. The buffer layer BF positioned between the front bracket 700F and the plate 600 may be referred to as a first buffer layer BF.

The rear bracket 700R may have a fixed portion 702R, a recessed portion 744, and a support column 744N. The fixed portion 702R may be located on the rear surface of second part 660 of plate 600 or may contact the rear surface of second portion 660. The buffer layer BF may be positioned between the fixed portion 702R of the rear bracket 700R and the rear surface of the second part 660 of the plate 600. The buffer layer BF may include, for example, a synthetic resin or a double-sided tape. The buffer layer BF may strengthen the bonding force between the front bracket 700F, the rear bracket 700R and the plate 600, and may prevent the plate 600 from being damaged. The buffer layer BF positioned between the plate 600 and the rear bracket 700R may be referred to as a second buffer layer BF.

The support column 744N may extend toward the front and/or rear of the rear bracket 700R from the recessed portion 744. The support column 744N may have a front portion 744NF and a rear portion 744NR. The front portion 744NF may extend forward of the rear bracket 700R from the depression 744. The rear portion 744NR may extend rearward of the rear bracket 700R from the depression 744. The length of the rear portion 744NR may be greater than the length of the front portion 744NF.

The front portion 744NF of the support column 744N may be positioned adjacent to the rear surface of the recessed portion 724 of the front bracket 700F through the coupling hole 670 of the second part 660 of the plate 600. The front portion 744NF of the support column 744N may be in contact with the rear surface of the recessed portion 724 of the front bracket 700F through the coupling hole 670 of the second part 660 of the plate 600. The support columns 741N, 742N, 743N and 744N may be formed and positioned on the rear surface of the rear bracket 700R corresponding to the holes h2, h4, h6 and h8 of the rear bracket 700R.

The fastening member f8 may be inserted into the support column 744N of the rear bracket 700R through the hole h8 of the front bracket 700F and the hole h8 of the rear bracket 700R. The fastening member f8 may be screwed to the support column 744N. The description of the other fastening members f2, f4, and f6 may be also the same as the fastening member f8.

Figure 32:
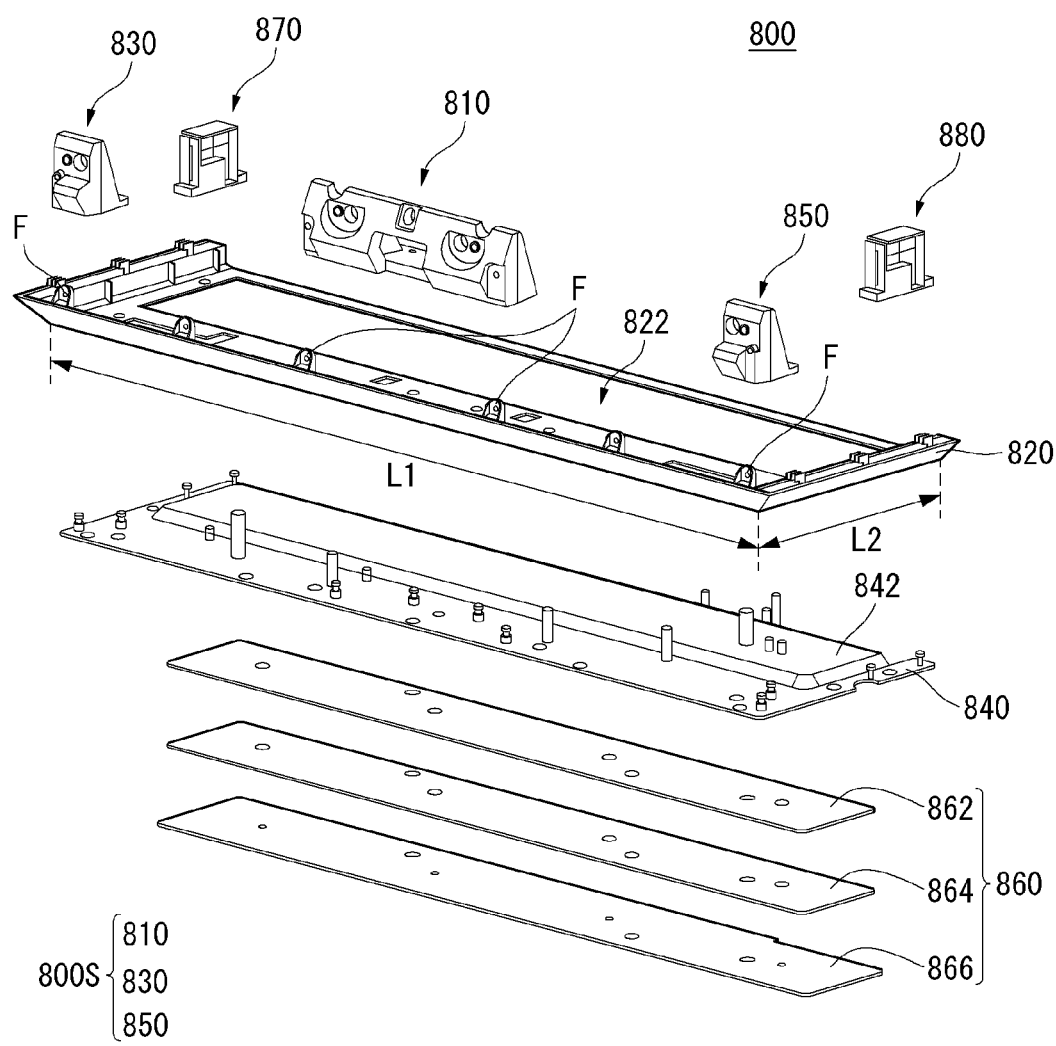
FIGS. 32 to 39 illustrate examples of coupling of a plate and a housing according to an embodiment.

Referring to FIG. 32, the supporter frame 820 may be elongated in the left and right direction or/and can be elongated in the back and forth direction. The left-right extension length L1 may be greater than the front-rear extension length L2. The supporter frame 820 may have an opening 822 at the center thereof. The supporter frame 820 may include a metal or a synthetic resin. The supporter frame 820 may have fixing bosses F. The fixing bosses F may be arranged at regular spacing at the front portion of the supporter frame 820.

The bottom plate 840 may be located at the lower side or on the lower surface of the supporter frame 820. The bottom plate 840 may be coupled to the lower portion of the supporter frame 820. The bottom plate 840 may have a dome 842. The dome 842 may be located in the opening 822 of the supporter frame 820. The bottom plate 840 may be coupled to the lower portion of the supporter frame 820, and then the dome 842 may be inserted into the opening 822 of the supporter frame 820.

The supporter weight 860 may be coupled with or fixed to the lower surface of the bottom plate 840. The supporter weight 860 may be accommodated in the dome 840 of the bottom plate 840. The supporter weight 860 may include a plurality of plates 862, 864, 866. The number and/or weight of the supporter weight 860 may be different in accordance with the size of the screen of the display device. The supporter weight 860 may include a metal. The supporter weight 860 may be referred to as a weight 860.

The supporter 800S may include a first supporter 810, a second supporter 830, and a third supporter 850. The first supporter 810 may be referred to as a center supporter 810. The second supporter 830 and/or the third supporter 850 may be referred to as a side supporter 830 and 850.

The first supporter 810 may be located at the center of the supporter frame 820 and may be fixed to the supporter frame 820. The second supporter 830 and the third supporter 850 may be located on the left and right sides of the supporter frame 820, respectively, and may be fixed to the supporter frame 820.

Tilting units or brackets 870 and 880 may be fixed or coupled to the supporter frame 820. The tilting units 870 and 880 may include a first tilting unit 870 and a second tilting unit 880. The first tilting unit 870 may be positioned at the left portion of the supporter frame 820 and the second tilting unit 880 may be positioned at the right portion of the supporter frame 820.

Figure 33:
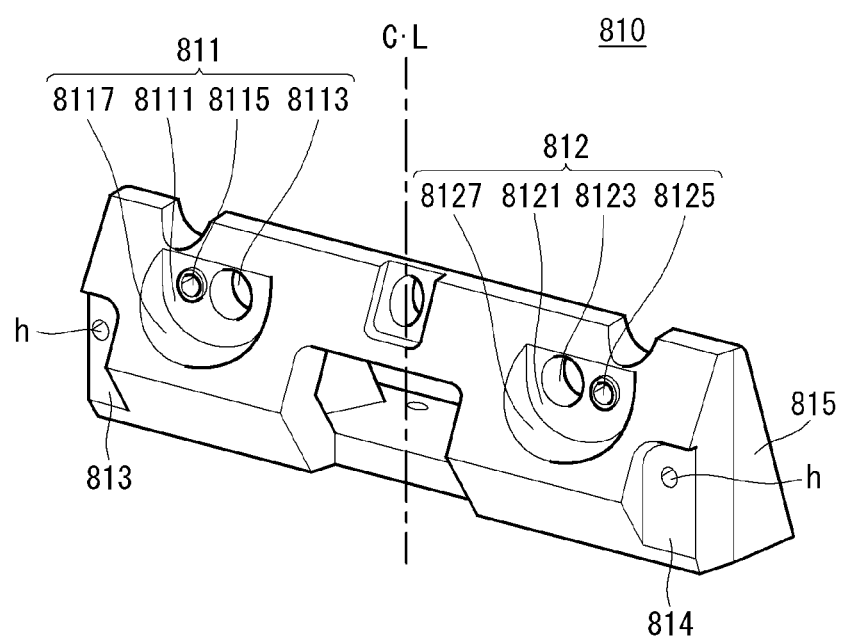

Referring to FIG. 33, the first supporter 810 may include a body 815, a first fixing part or countersink 811, a second fixing part or countersink 812, a third fixing part or countersink 813, and a fourth fixing part or countersink 814. The body 815 may have a shape of a bar elongated in the left-right direction. The body 815 may have a triangular or trapezoidal cross section as a whole. Accordingly, the body 815 may improve the standing stability of the first supporter 810.

The first fixing part 811 and/or the second fixing part 812 may be formed on the front surface of the body 815. The first fixing part 811 may be symmetrical with the second fixing part 812 with respect to the center line CL of the body 815. The first fixing part 811 may include a depression 8111, an insertion portion or hole 8113, and a fixing hole 8115. The depression 8111 may be recessed from the front surface of the body 815 to the inside of the body 815. A support portion or surface 8117 may be formed by the depression 8111.

The recessed portion 744 (see FIG. 31) may have a shape corresponding to the depression 8111. The rear surface of the recessed portion 744 may face or be in contact with the front surface of the depression 8111. The recessed portion 744 may be conformable to the depression 8111. The support portion 8117 may support at least a part of the lower portion of the recessed portion 744.

The insertion portion 8113 may be formed in a part of the depression 8111. The fixing hole 8115 may be formed in a part of the depression 8111 and may be located adjacent to the insertion portion 8113. The insertion portion 8113 and the fixing hole 8115 may be formed as a pair. The diameter of the insertion portion 8113 may be greater than the diameter of the fixing hole 8115. The support column 744N (see FIG. 31) may be inserted into the insertion portion 8113.

The fastening member f3 (see FIGS. 27 and 28) which passes through the hole h3 of the second recessed portion 722 of the front bracket 700F and the hole h3 of the second recessed portion 742 of the rear bracket 700R, may be inserted into the fixing hole 8115. The description of the second fixing part 812 is omitted because the second fixing part 812 is symmetric with the first fixing part 811.

The third fixing part 813 may be formed on the front surface of the body 815. The third fixing part 813 may be positioned adjacent to a side of the body 815. The fourth fixing part 814 may be symmetric with the third fixing part 813 with respect to the center line CL of the body 815. For example, from the viewpoint at the front of the body 815, the third fixing part 813 may be positioned on the left side, and the fourth fixing part 814 may be located on the right side. The third fixing part 813 and/or the fourth fixing part 814 may be recessed or formed inward of the body 815 from the front surface of the body 815. The third fixing part 813 may have a fastening hole h. The fastening hole h of the third fixing part 813 and/or the fastening hole h of the fourth fixing part 814 may be combined with the fixing bosses F (see FIG. 32).

Figure 34:
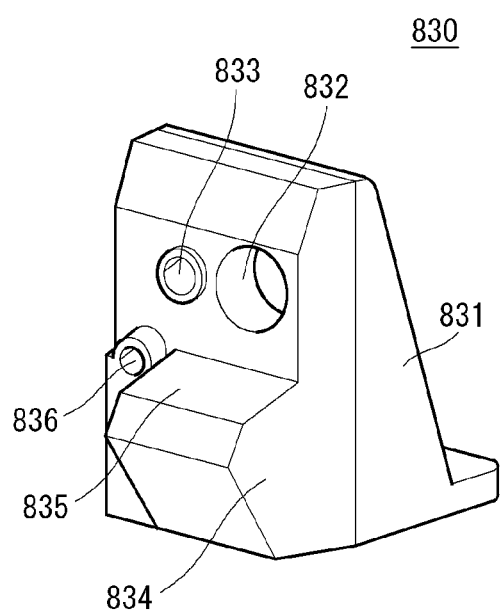

Referring to FIG. 34, the second supporter 830 may include a body 831, an insertion portion or hole 832, a fixing hole 833, a support portion 834, and a fastening hole 836. The body 831 may have a triangular or trapezoidal cross section as a whole. Accordingly, the body 831 may improve the standing stability of the second supporter 830.

The insertion portion 832 may be formed on a part of the front surface of the body 831. The fixing hole 833 may be formed at the front surface of the body 831 and may be located adjacent to the insertion portion 832. The insertion portion 832 and the fixing hole 833 may be formed as a pair. The diameter of the insertion portion 832 may be greater than the diameter of the fixing hole 833. The support column 744N (see FIG. 31) may be inserted into the insertion portion 832.

The support portion 834 may be formed at a lower portion of the body 831. The support portion 834 may protrude toward the front of the body 831. The support portion 834 may be located at a lower side of the insertion portion 832 or the fixing hole 833. The support portion 834 may form a step 835 at the lower side of the insertion portion 832 and/or the fixing hole 833. The support portion 834 may support the lower portion or the rear portion of the recessed portion 744 (see FIG. 31) of the rear bracket 700R or the rear bracket 700R.

The fastening member f1 (see FIGS. 27 and 28) which passes through the hole h1 of the first recessed portion 721 of the front bracket 700F and the hole h1 of the first recessed portion 741 of the rear bracket 700R, may be inserted into the fixing hole 833. The fastening hole 836 may be formed on the front surface of the body 831. The fastening hole 836 may be located adjacent to the support portion 834. The fastening hole 836 may be positioned at the left side of the support portion 834 and the support portion 834 may be positioned at the right side of the fastening hole 836, when the body 831 is viewed from the front. The fastening hole 836 may be coupled with the fixing bosses F (see FIG. 32).

Figure 35:
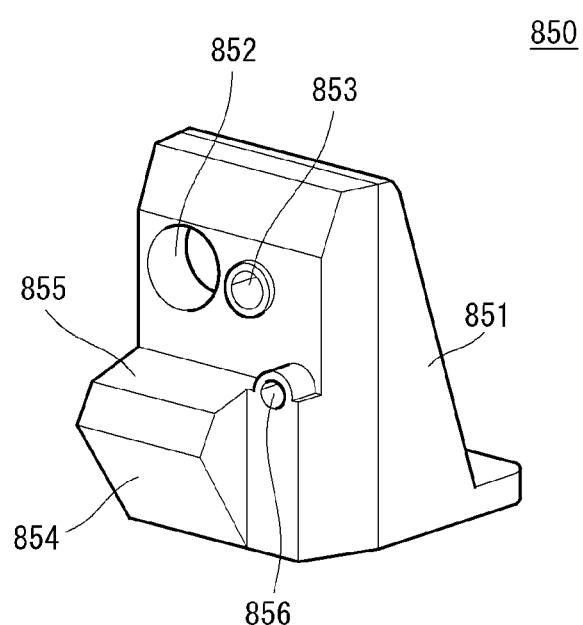

Referring to FIG. 35, the third supporter 850 may include a body 851, an insertion portion or hole 852, a fixing hole 853, a support portion 854, and a fastening hole 856. The body 851 may have a triangular or trapezoidal cross section as a whole. Accordingly, the body 851 may improve the standing stability of the second supporter 850.

The insertion portion 852 may be formed on a part of the front surface of the body 851. The fixing hole 853 may be formed at the front surface of the body 851 and may be located adjacent to the insertion portion 852. The insertion portion 852 and the fixing hole 853 may be formed as a pair. The diameter of the insertion portion 852 may be greater than the diameter of the fixing hole 853. The support column 744N (see FIG. 31) may be inserted into the insertion portion 852.

The support portion 854 may be formed at a lower portion of the body 851. The support portion 854 may protrude toward the front of the body 851. The support portion 854 may be located at a lower side of the insertion portion 852 or the fixing hole 853. The support portion 854 may form a step 855 at the lower side of the insertion portion 852 and/or the fixing hole 853. The support portion 854 may support the lower portion or the rear portion of the recessed portion 744 (see FIG. 31) of the rear bracket 700R or the rear bracket 700R.

The fastening member f7 (see FIGS. 27 and 28) which passes through the hole h7 of the fourth recessed portion 724 of the front bracket 700F and the hole h7 of the fourth recessed portion 744 of the rear bracket 700R, may be inserted into the fixing hole 853. The fastening hole 856 may be formed on the front surface of the body 851. The fastening hole 856 may be located adjacent to the support portion 854. The fastening hole 856 may be positioned at the right side of the support portion 854 and the support portion 854 may be positioned at the left side of the fastening hole 856, when the body 851 is viewed from the front. The fastening hole 856 may be coupled with the fixing bosses F (see FIG. 32).

Figure 36A:
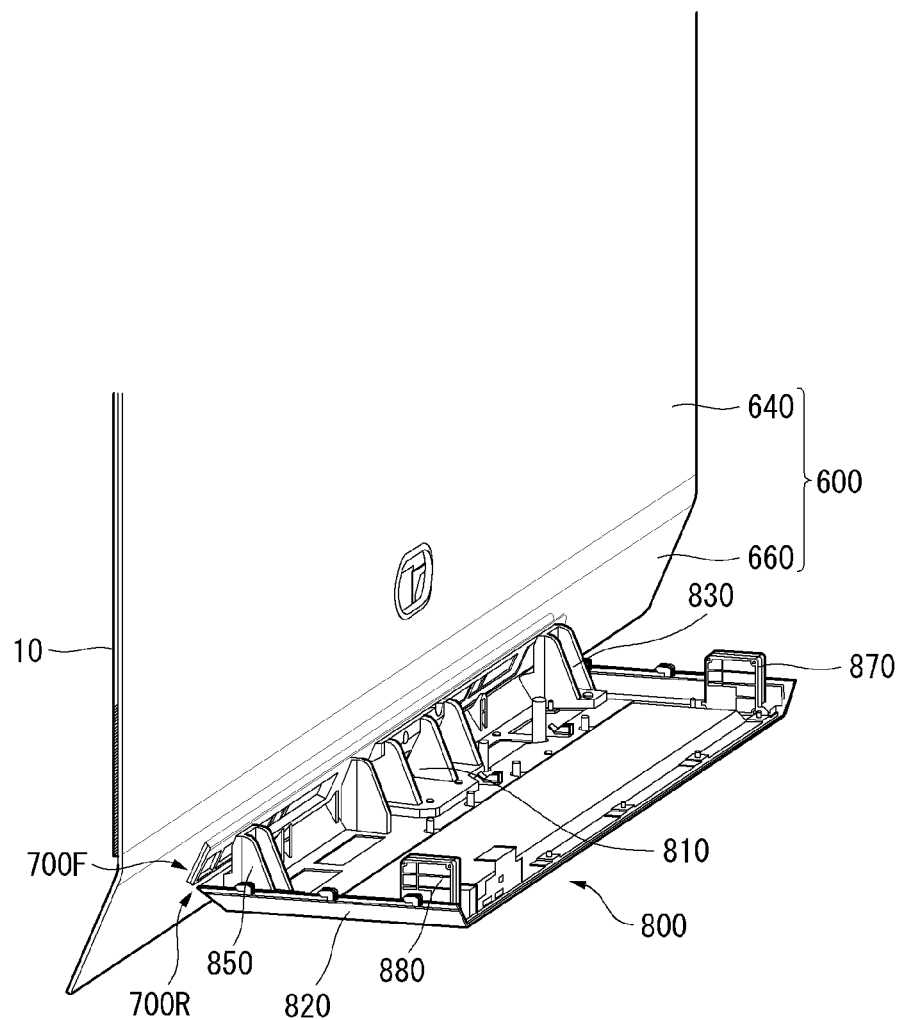
Figure 36B:
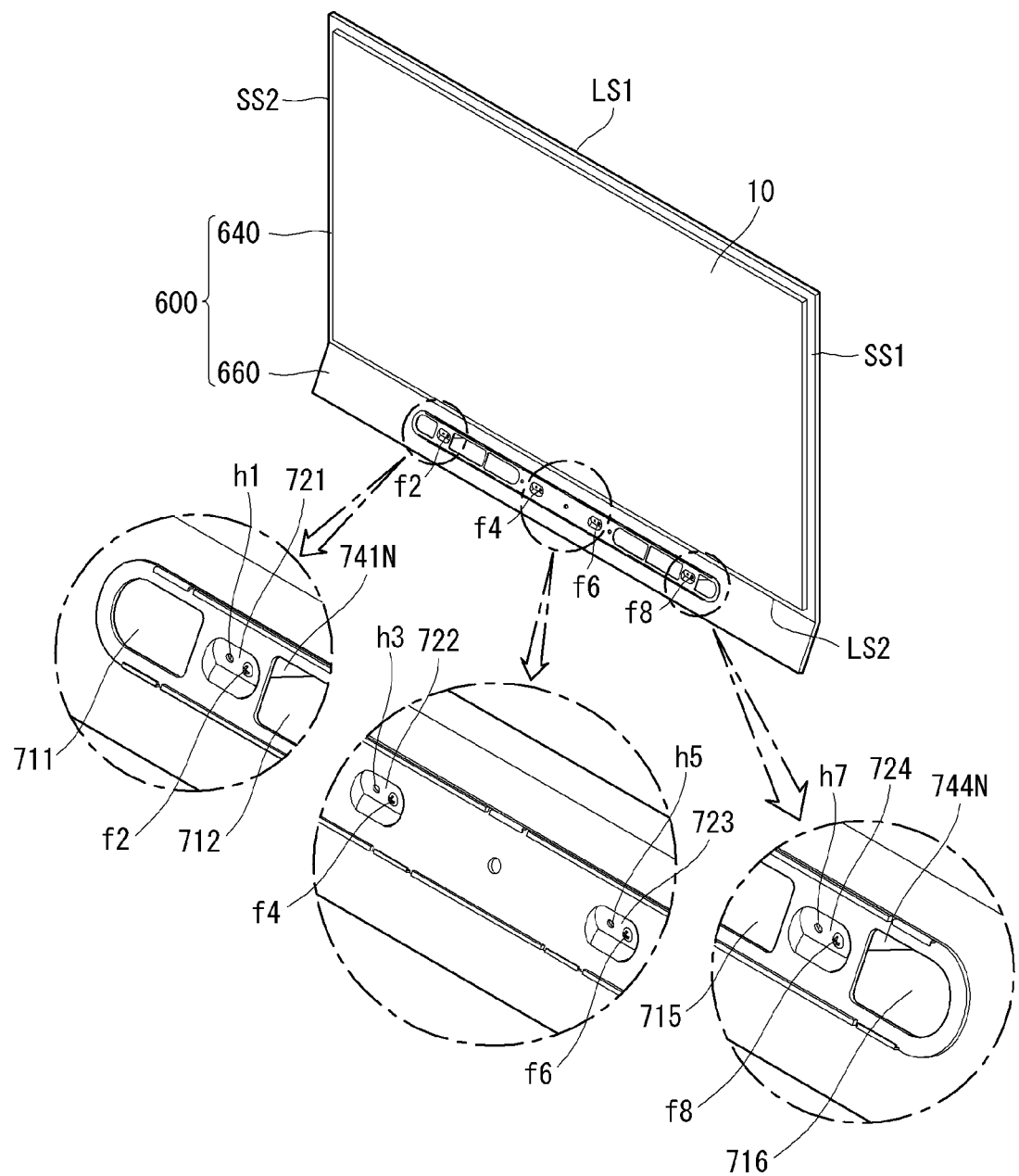
Figure 37:
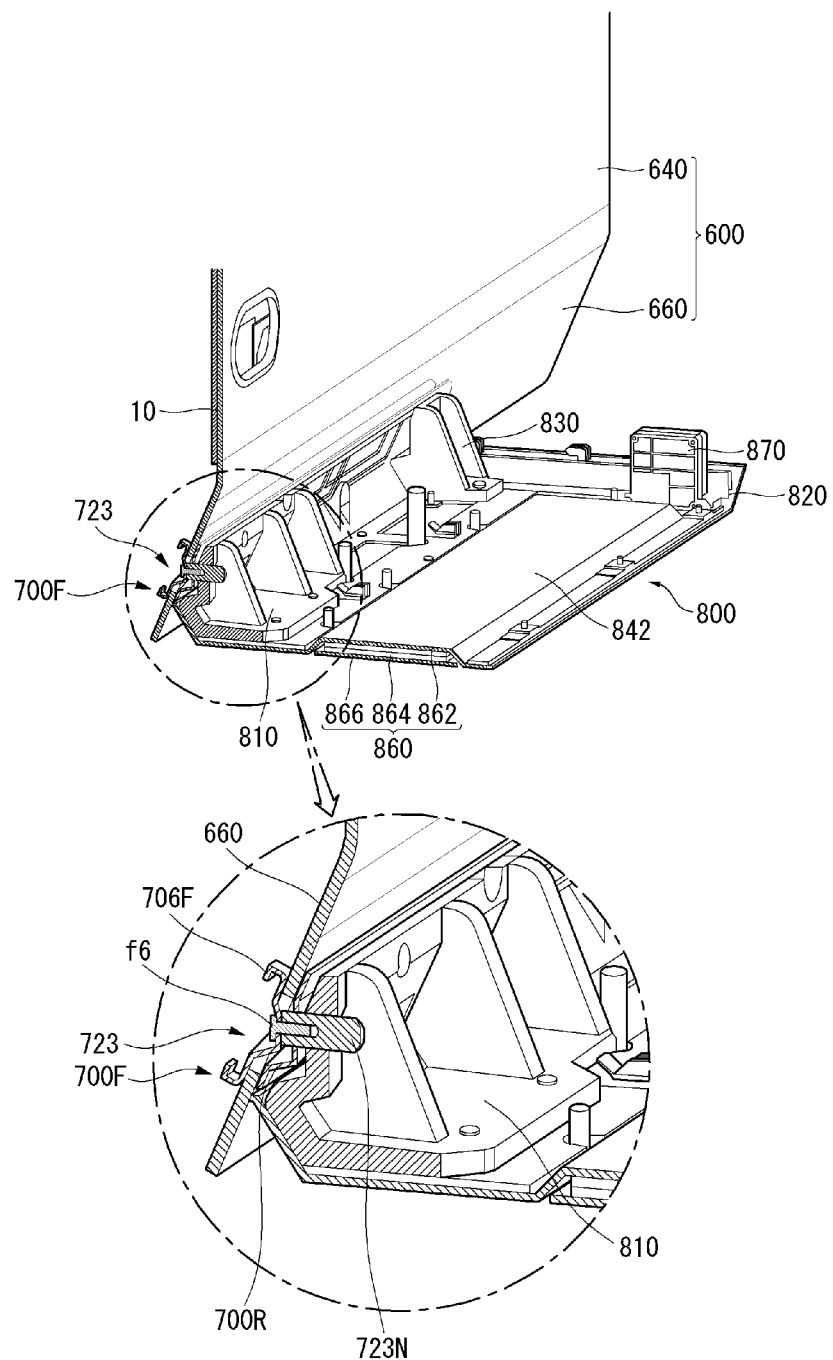

Referring to FIGS. 36 and 37, the housing 800 may be coupled to the plate 600. The housing 800 may be coupled or fixed to the second part 660 of the plate 600. Referring to FIG. 36A and the related drawings, the housing 800 may be coupled to the rear surface of the second part 660 of the plate 600. The combination of the housing 800 and the second part 660 of the plate 600 may be achieved by the following structures: (i) a structure that the front bracket 700F is fastened to the front surface of the second part 660 of the plate 600, (ii) a structure that the rear bracket 700R is fastened to the rear surface of the second part 660 of the plate 600, (iii) a structure that the front bracket 700F and the rear bracket 700R are fastened by the fastening members f2, f4, f6, and f8, and (iv) a structure that the support columns 741N, 742N, 743N, 744N and/or the fastening members f1, f3, f5, f7 are fastened or fixed to the supporters 810, 830, and 850.

Referring to FIG. 36B and the related drawings, the fastening members f1, f3, f5 and f7 may be fastened to the supporters 810, 830, and 850 of the housing 800, through the holes h1, h3, h5 and h7 of the front bracket 700F and the rear bracket 700R. Referring to FIG. 37 and the related drawings, supporters 810 and 830 may be fixed or mounted on supporter frame 820. The fastening members f2, f4, f6 and f8 may be inserted into and may be fastened to the support columns 741N, 742N, 743N and 744N, through the holes h2, h4, h6 and h8 of the front bracket 700F and the rear bracket 700R. The support columns 741N, 742N, 743N, and 744N may be inserted into the insertion portions 8113, 8123, 832, and 852 of the supporters 810, 830, and 850.

The coupling of the support columns 741N, 742N, 743N and 744N with the supporters 810, 830 and 850, as a temporary fixing, may facilitate coupling of the fastening members f1, f3, f5, and f7 (see FIG. 36b) and the supporters 810, 830, and 850 of the housing 800, through the holes h1, h3, h3, and h7 of the front bracket 700F and the rear bracket 700R. The coupling of the support columns 741N, 742N, 743N and 744N with the supporters 810, 830 and 850, may provide rigidity to the coupling structure of the plate 600 and the housing 800.

Figure 38:
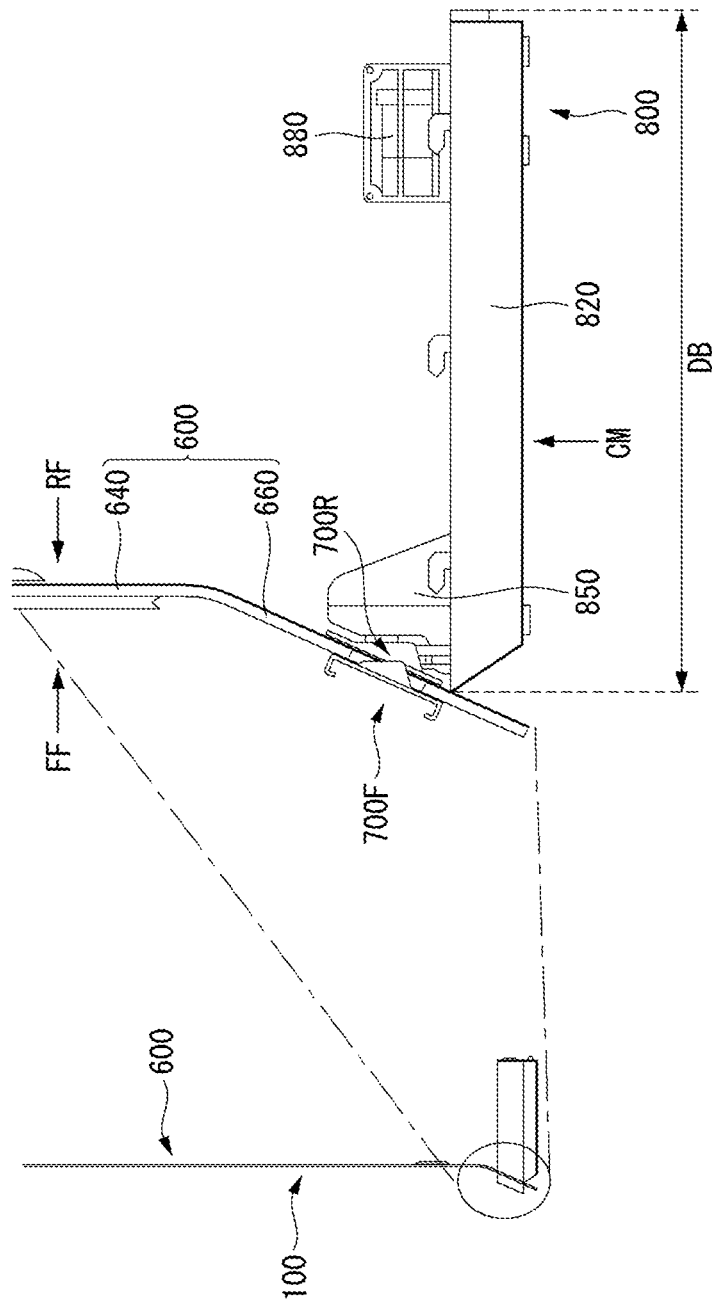

Referring to FIG. 38, the second part 660 of the plate 600 may be bent from the first part 640. The second part 660 may be fixed to the front portion of the housing 800. The center of mass (CM) of the plate 600 and the housing 800 may be located at the front portion of the housing 800 and adjacent to the center of the housing 800. Accordingly, in case that the external force FF is applied to the plate 600 from the front side of the plate 600, the structural stability of the display device 100 can be secured by the length of the housing 800 in a front-back direction.

Accordingly, in case that the external force RF is applied to the plate 600 from the rear side of the plate 600, the supporter weight 860 (see FIG. 37) may prevent the display device from tumbling over. The bending of the plate 600 may provide the display device with stability in terms of center of mass.

Figure 39:
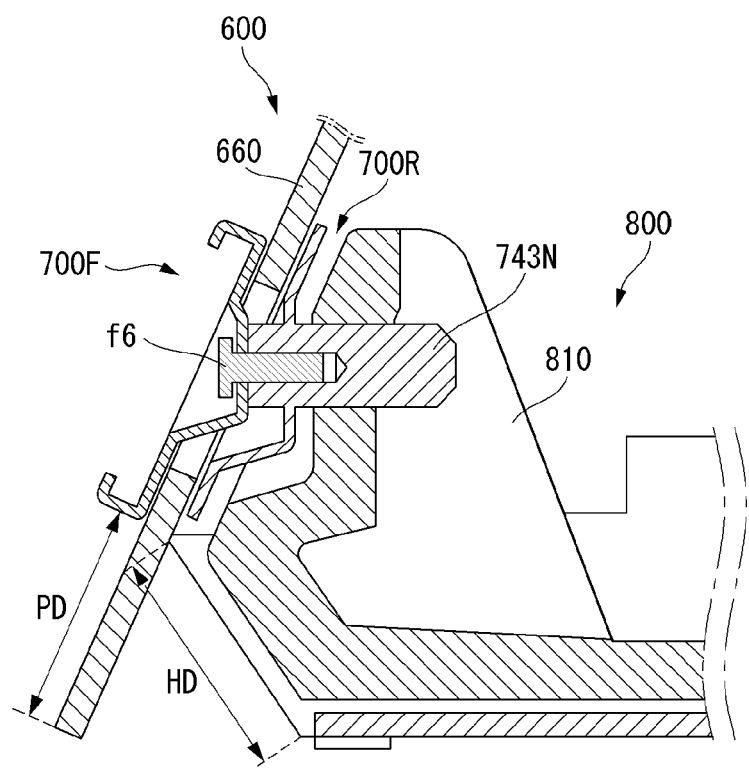

Referring to FIG. 39, the lower end portion PD of the second part 660 of the plate 600 may have a certain length. The housing 800 may have a retreated portion HD. The retreated portion HD may be spaced from the lower end portion PD of the plate 600. The length of the lower end portion PD of the plate 600 may be substantially the same as the length of the retreated portion HD of the housing 800. For example, the lower end portion PD of the plate 600 and the retreated portion HD of the housing 800, may form a triangle. Accordingly, the lower end portion PD of the plate 600 may prevent the display device from rolling forward.

Figure 40:
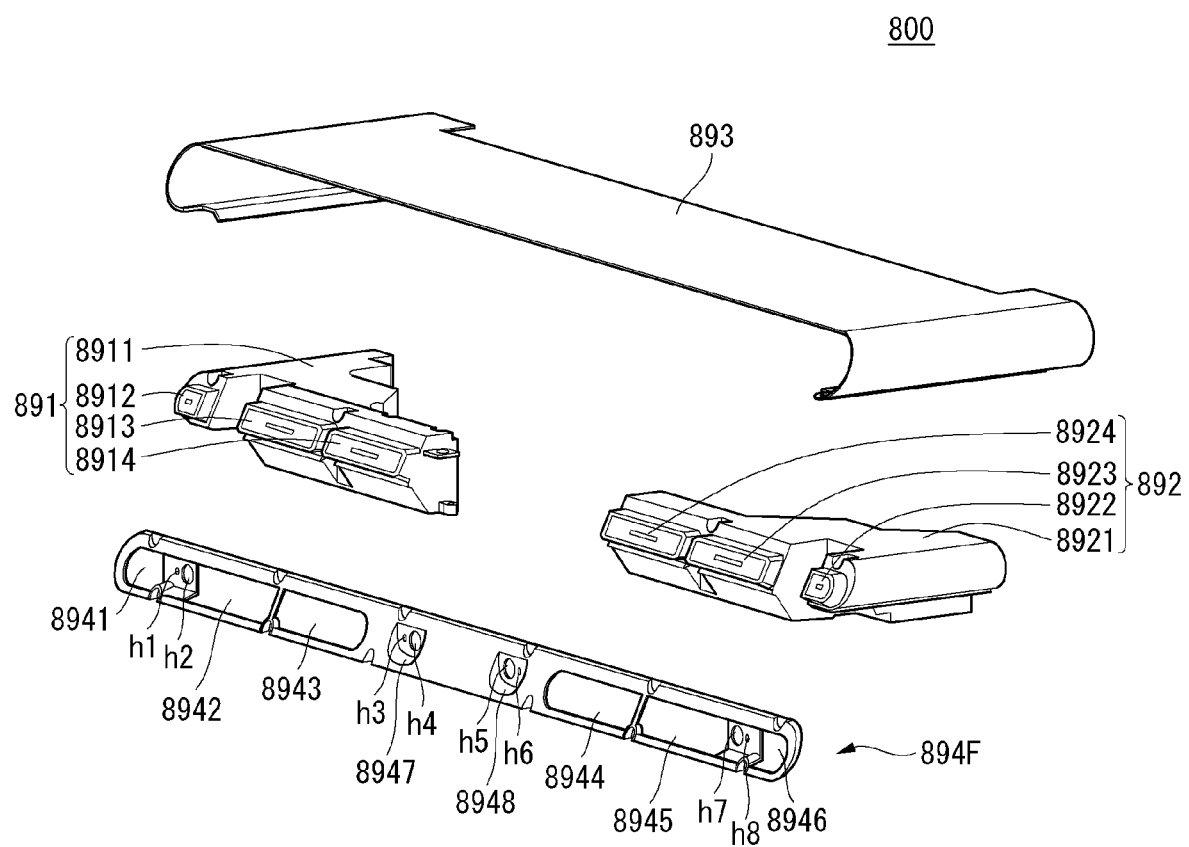
FIGS. 40 to 42 illustrate examples of the structure of the housing according to an embodiment.

Referring to FIG. 40, the housing 800 may include speaker units or assemblies 891 and 892, a front cover 894F, and a top cover 893. The speaker units 891 and 892 may include a first speaker unit 891 and a second speaker unit 892. The second speaker unit 892 can be explained as same as the first speaker unit 891.

The first speaker unit 891 may include a body 8911, a first speaker 8912, a second speaker 8913, and a third speaker 8914. The body 8911 may provide an empty space. The empty space of the body 8911 may communicate with the first to third speakers 8912, 8913, and 8914. The first speaker 8912 may provide a high-frequency sound. The second speaker 8913 may provide a low-frequency sound. The third speaker 8914 may provide a sound of a mid-band or a voice-tone. For example, the first speaker 8912 may be a tweeter, the second speaker 8913 may be a woofer, and the third speaker 8914 may be a middle range speaker.

The top cover 893 may be positioned at an upper side of the first speaker unit 891 and/or the second speaker unit 892. The top cover 893 may cover the first speaker unit 891 and/or the second speaker unit 892. The top cover 893 may be a flat plate. The left and right portions of the top cover 893 may be rounded. The first speaker 891 may be positioned at the left side of the top cover 893 and the second speaker 892 may be positioned at the right side of the top cover 893 when the housing 800 is viewed from the front.

The front cover 894R may be positioned in front of the top cover 893. The front cover 894R may be positioned in front of the first speaker 891 and/or the second speaker 892. The front cover 894R may have a first opening 8941 to a sixth opening 8946.

The first opening 8941 may correspond to the first speaker 8912 of the first speaker unit 891. The second opening 8942 may correspond to the second speaker 8913 of the first speaker unit 891. The third opening 8943 may correspond to the third speaker 8914 of the first speaker unit 891.

The fourth opening 8944 may correspond to the third speaker 8924 of the second speaker unit 892. The fifth opening 8945 may correspond to the second speaker 8923 of the second speaker unit 892. The sixth opening 8946 may correspond to the first speaker 8946 of the second speaker unit 892.

The front cover 894F may have recessed portions 8947 and 8948. The recessed portions 8947 and 8948 of the front cover 894F may be explained by adopting the explanation about the front bracket 700F or the rear bracket 700R described above. The front cover 894F may have a plurality of holes h1 to h8. The description of the holes h1 to h8 may be conducted by borrowing the description of the front bracket 700F or the rear bracket 700R.

Figure 41:
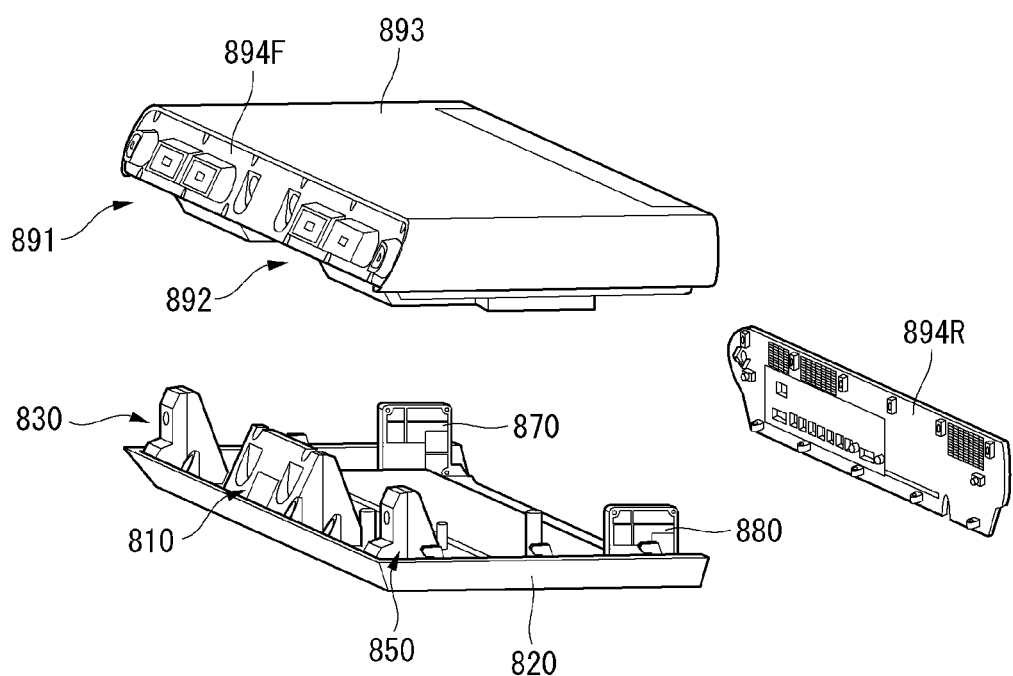

Referring to FIG. 41, the top cover 893 may be coupled to the supporter frame 820. The back cover 894R may block the space formed by the top cover 893 and the supporter frame 820 at the rear side of the space. The front cover 894F may be coupled with the embodiments of the combination of the plate 600, the front bracket 700F, the rear bracket 700R, and the supporters 810, 830, 850 which was described with reference to FIGS. 37 to 39.

Referring to FIGS. 37 to 41, the front cover 894F may be positioned adjacent to the front or front of the supporters 810, 830, 850. The rear bracket 700R may be positioned in front of the front cover 894F or adjacent to or in contact with the front surface of the front cover 894F. The front bracket 700F may be coupled with the front portion of the rear bracket 700R. The plate 600 may be fixed between the front bracket 700F and the rear bracket 700R.

Figure 42:
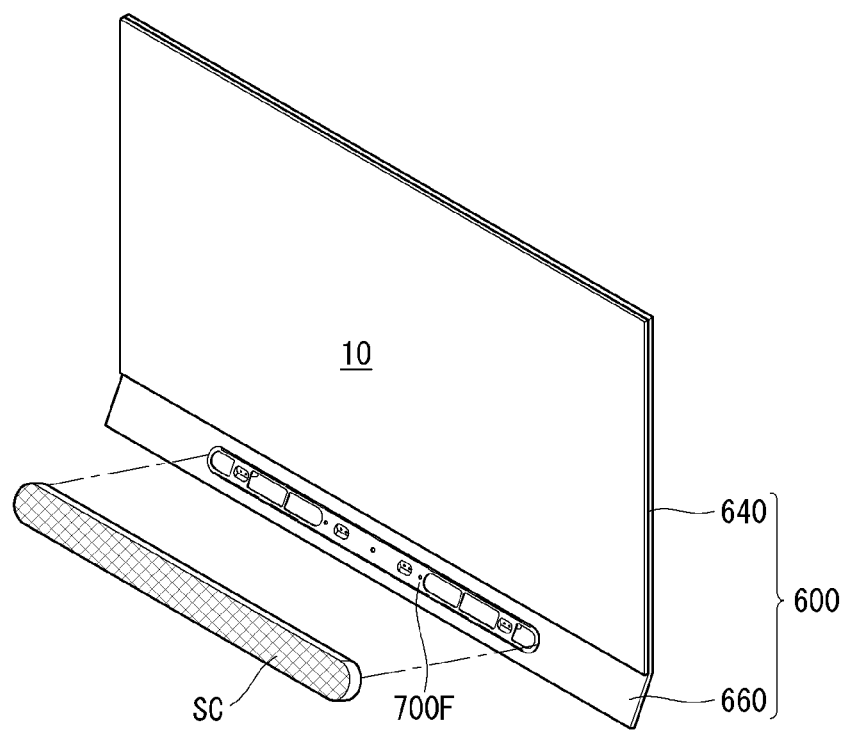

Referring to FIG. 42, a speaker cover SC may be coupled or fixed to the front bracket 700F exposed frontward of the second part 660 of the plate 600. For example, the speaker cover SC may be formed of a metal mesh or a woven mesh.

Figure 43:
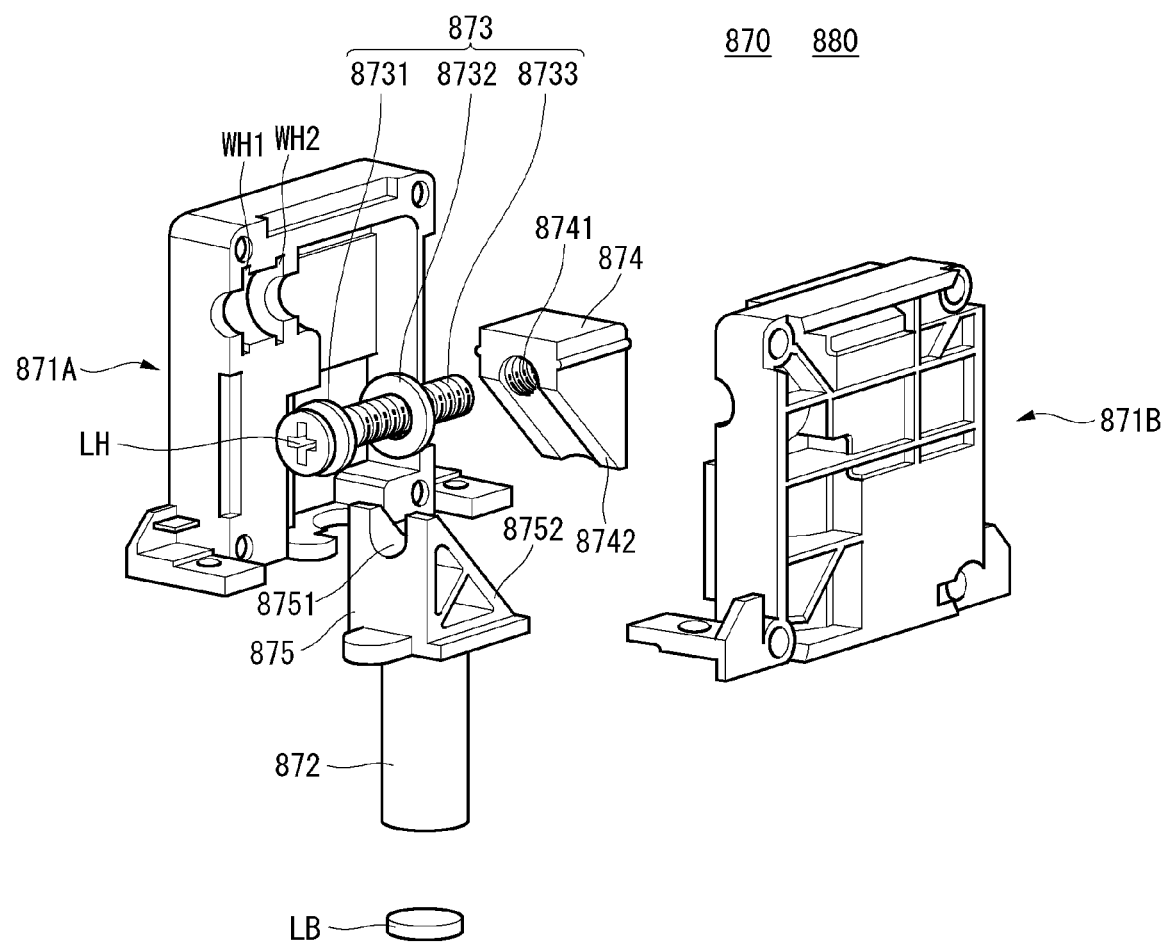
FIGS. 43 to 45 illustrate examples of a tilting structure according to an embodiment.

Referring to FIG. 43, the tilting units 870 and 880 may include a case 871A and 871B, a leg 872, a shaft 873, a mover 874, and a slider 875. The second tilting unit 880 may have the same configuration as the first tilting unit 870. The first tilting unit 870 will be described, and the description of the second tilting unit 880 will be omitted.

The cases 871A and 871B may include a first case 871A and a second case 871B. The first case 871A can be coupled with the second case 871B. The first case 871A and the second case 871 B may form an internal space. The internal space may be provided for the moving mechanism of the tilting units 870, 880. The cases 871A and 871B may have washer grooves WH1 and WH2.

The shaft 873 may be mounted in the case 871A and 871B. The shaft 873 can be installed inside the case 871A and 871B. A part of the shaft 873 may be exposed to the outside of the case 871A and 871 B. The shaft 873 may be rotatable in the case 871A and 871B. The shaft 873 may have threads 8733 on its outer circumferential surface. The threads 8733 may be formed on the entire circumference of the shaft 873, or may be formed on a part thereof. The shaft 873 may have a wrench groove LH. The shaft 873 may have washers 8731 and 8732. The washers 8731 and 8732 may be fitted in the washer grooves WH1 and WH2.

The mover 874 may move linearly in the case 871A and 871B. The mover 874 may move in conjunction with the shaft 873. When the shaft 873 rotates, the mover 874 may move in a straight line. The shaft 873 may be inserted into the mover 874. The mover 874 may have a thread 8741 which is coupled with the thread 8733 of the shaft 873. The mover 874 may have an inclined portion 8742 or an inclined surface 8742. The inclined surface 8742 may be formed between the front surface and the bottom surface of the mover 874. The inclined surface 8742 of the mover 874 may be referred to as a first inclined surface 8742.

The slider 875 may move up and down in the case 871A and 871B. The slider 875 may move up and down in accordance with the movement of the mover 874 while being in contact with the mover 874. The mover 874 may move in a horizontal direction. The mover 874 may move, for example, in a front-back direction or in a left-right direction. When the mover 874 moves in a front-back direction, the slider 875 may move in an up-down direction. When the mover 874 moves in an up-down direction, the slider 875 may move in a left-right direction.

The slider 875 may have an inclined portion 8752 or an inclined surface 8752. The inclined surface 8752 of the slider 875 may be formed between the rear surface and the upper surface of the slider 875. The inclined surface 8752 of the slider 875 may face or contact the inclined surface 8742 of the mover 874. The inclined surface 8752 of the slider 875 may rub against the inclined surface 8742 of the mover 874. The slider 875 may have an axial groove 8751 at the upper portion of the slider 875. The shaft 873 may be placed in the shaft groove 8751. The inclined surface 8752 of the slider 875 may be referred to as a second inclined surface 8752.

The leg 872 may be coupled to or formed at the lower portion of the slider 875. The leg 872 may have a shape of an elongated cylinder. The leg 872 may be installed in the case 871A and 871B. Depending on the movement of the slider 875, a part of the leg 872 may be exposed or moved out of the case 871A and 871 B. Leg 872 may have pads LB. The pad LB may be prevent skidding of the leg 872.

Figure 44:
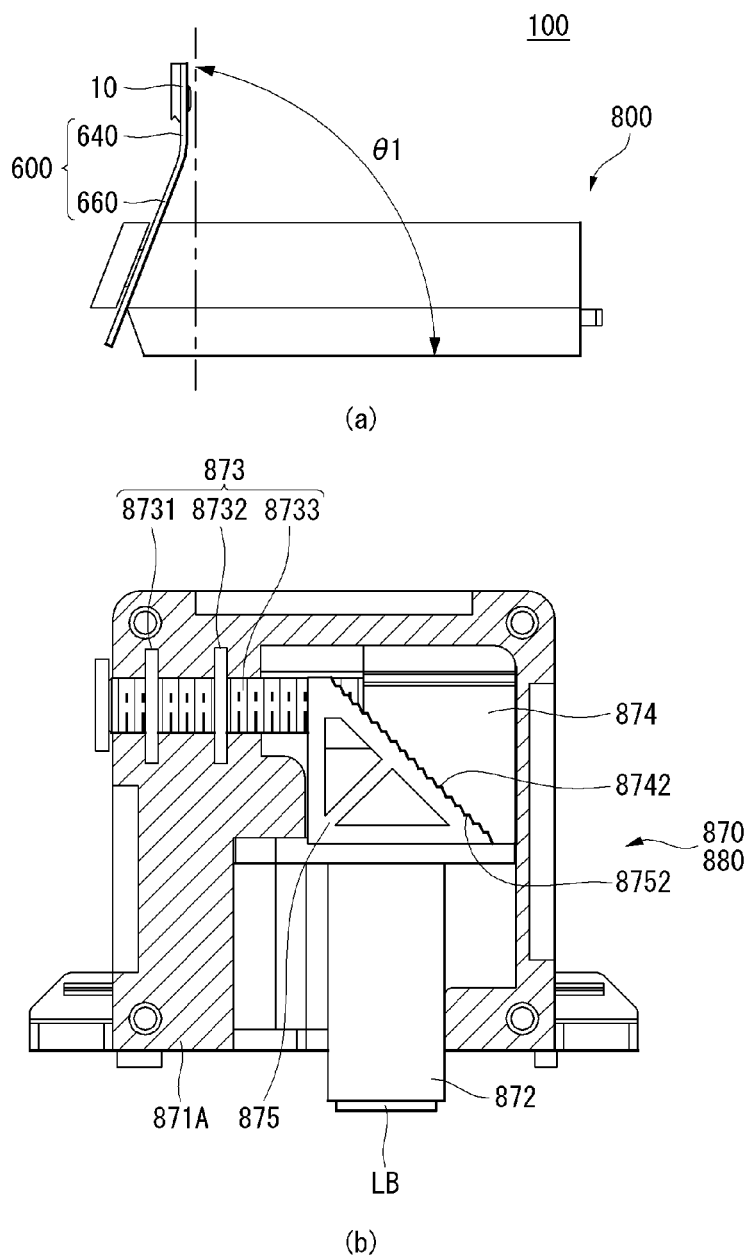

Referring to FIG. 44, the shaft 873 has been rotated fully in a counterclockwise direction and the mover 874 may be located at a rear portion of the case 871A. The display device 100 may be kept horizontal. For example, the angle 81 between the ground and the head 10 may be 90 degrees.

Figure 45:
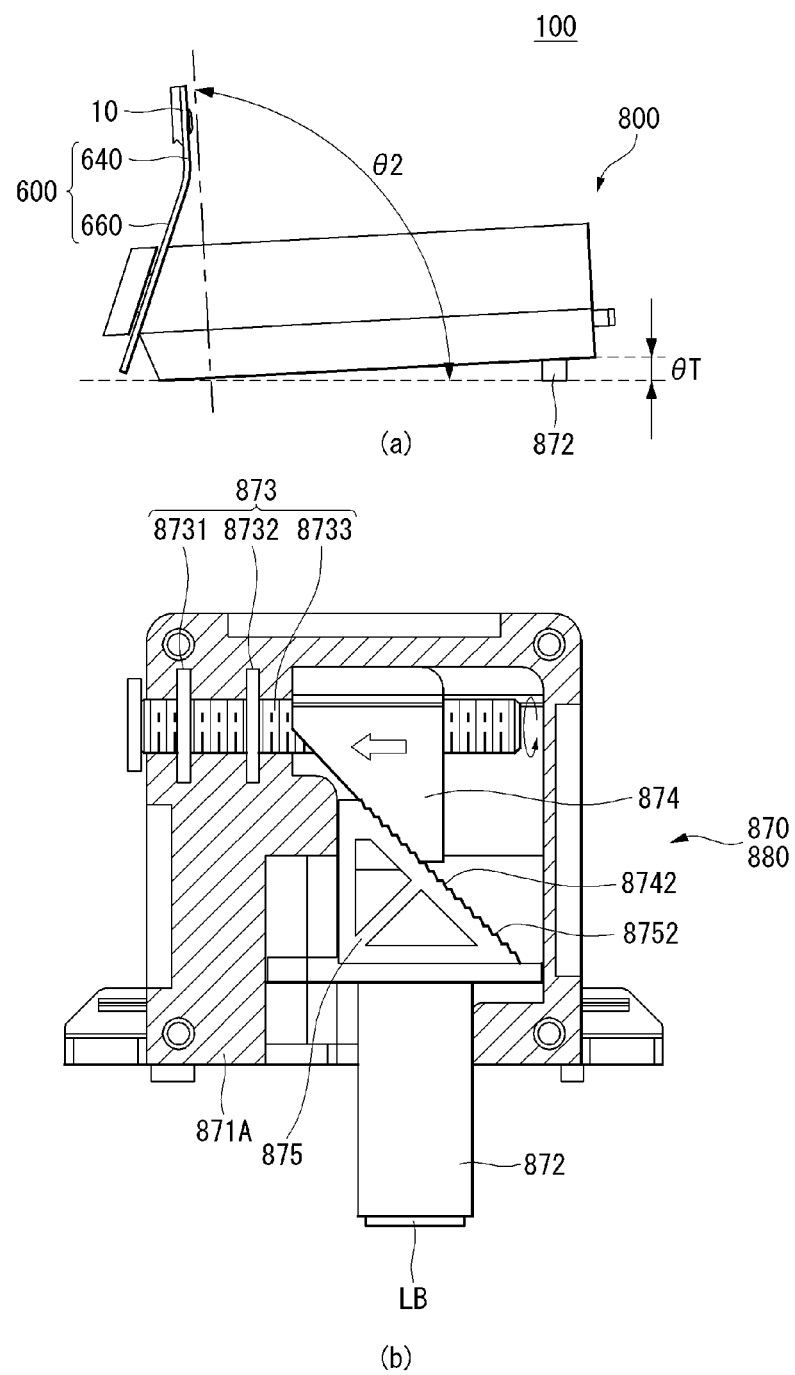

Referring to FIG. 45, the shaft 873 has been rotated clockwise and the mover 874 has moved in a direction from the rear portion of the case 871A to the front portion of the case 871A. At this time, the slider 875 may move downward within the case 871A by the movement of the mover 874.

The leg 872 may be exposed to the outside of the lower surface of the case 871A and a part of the leg 872 may go out of the case 871A. Accordingly, the display device 100 may be tilted, and the angle 82 of the head 10 may be different from the angle 81 (see FIG. 44). The angle between the ground and the head 10 may depend on the relative position of the mover 874 with respect to the slider 875.

Figure 46:
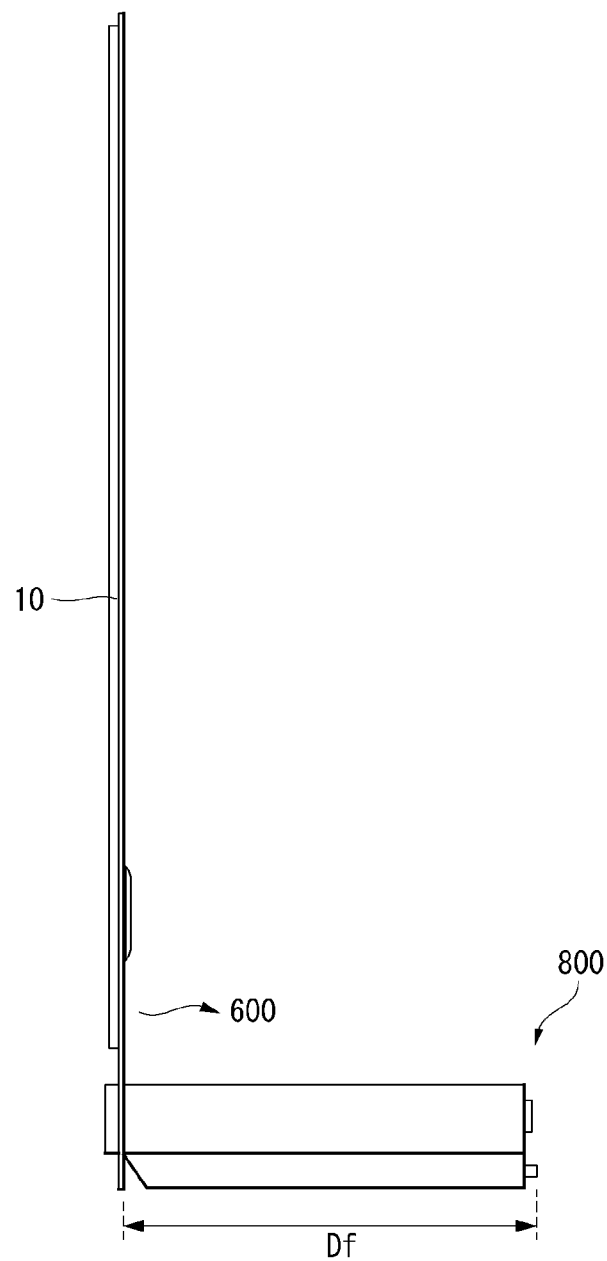
FIG. 46 illustrates an example of a flat plate according to an embodiment.

Referring to FIG. 46, the plate 600 may be flat. The length Df of the housing 800 in the front-back direction may be increased for the overall balance of the display device 100. For example, the length Df of the housing 800 in the front-back direction may be greater than the length DB (see FIG. 38) of the housing 800 in the front-back direction. The plate 600 shown in FIG. 46 can be referred to as a flat plate 600.

Figure 47:
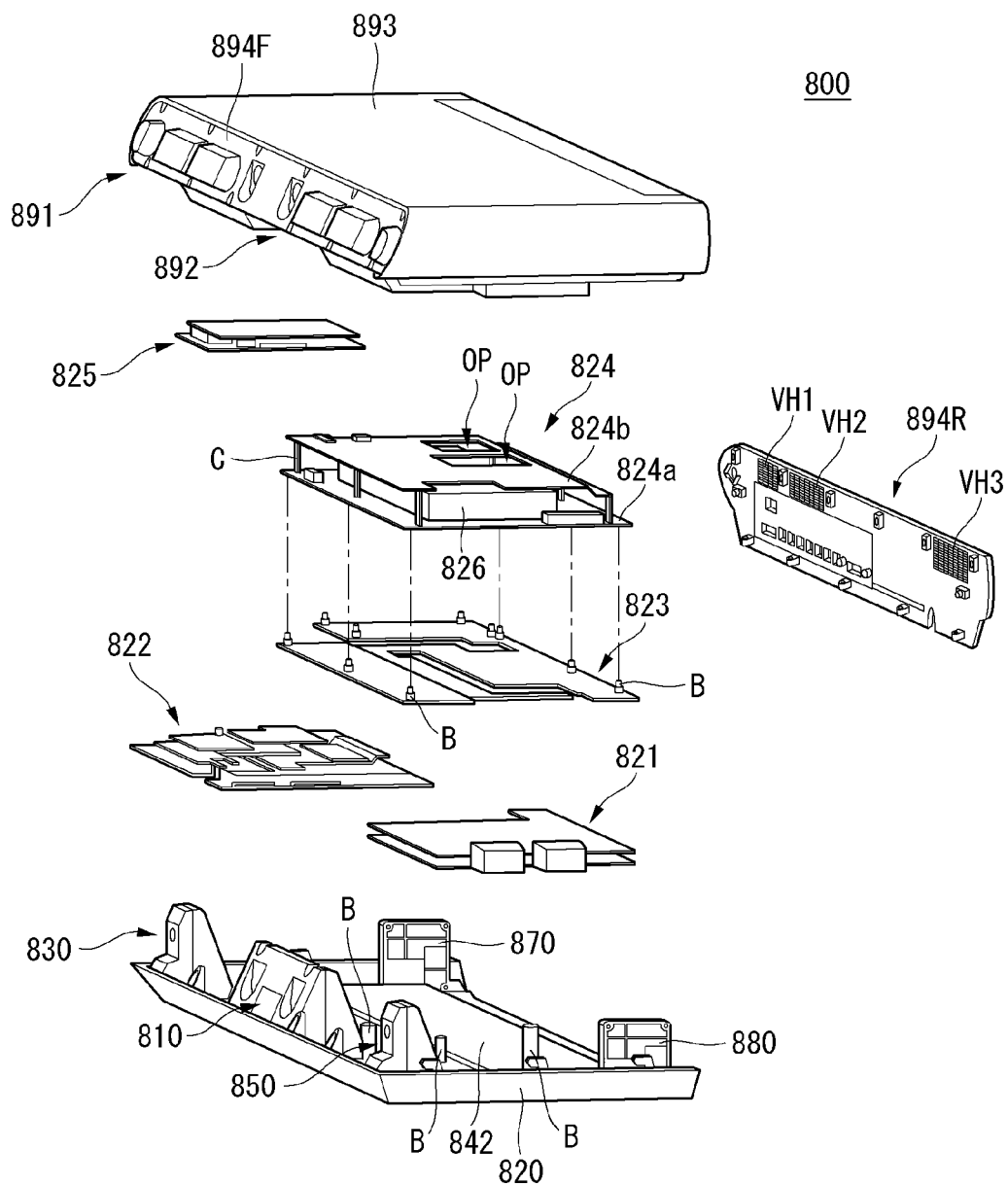
FIGS. 47 to 49 illustrate examples of a control unit according to an embodiment.
Figure 48:
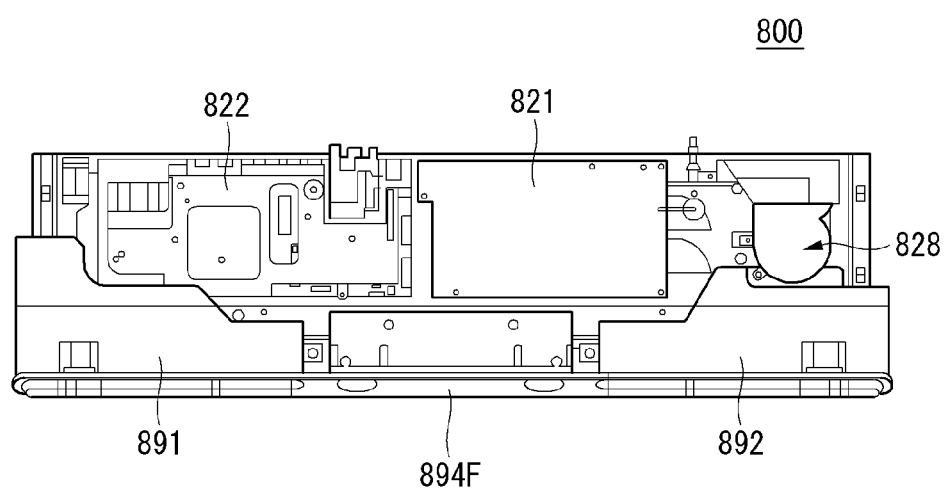
Figure 49:
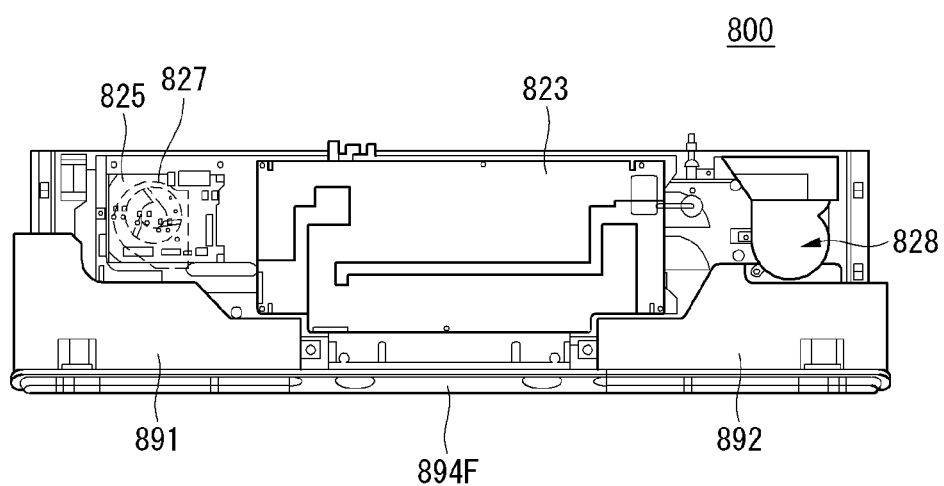

Referring to FIGS. 47 to 49, a central portion of the supporter frame 820 may be flat. The flat central portion of the supporter frame 820 may be provided by the dome 842. The first PCB 821 may be positioned or mounted on the supporter frame 820. The first PCB 821 may be mounted on the dome 842. For example, the first PCB 821 may be a T-CON board. The first PCB 821 may be located behind the first supporter 810 and may be located adjacent to the second tilting unit 880.

The second PCB 822 may be positioned or mounted on the supporter frame 820. The second PCB 822 may be positioned adjacent to the first PCB 821. The second PCB 822 may be located behind the first supporter 810 and/or the second supporter 830 and may be located adjacent to the first tilting unit 870. For example, the second PCB 822 may be a main board.

The plate 823 may cover the first PCB 821 and/or the second PCB 822. The plate 823 may be mounted on the supporter frame 820. The plate 823 may be positioned on the first PCB 821 and/or the second PCB 822. The plate 823 may be spaced apart from the first PCB 821 and/or the second PCB 822. Air may flow through the space formed between the plate 823 and the first PCB 821, and/or between the plate 823 and the second PCB 822. The plate 823 may include, for example, a metal. The plate 823 may be mounted on the boss B of the supporter frame 820. The plate 823 may be referred to as a first plate 823. The heat generated from the first PCB 821 and/or the second PCB 822 may be transmitted to the first plate 823.

A plate 824 may be positioned or mounted on the first plate 823. The plate 824 may be referred to as a second plate 824. The second plate 824 may be mounted on the boss B of the first plate 823. The second plate 824 may have a multi-layer structure. The second plate 824 may include a lower plate 824a and an upper plate 824b. The lower plate 824a may be a flat plate. The upper plate 824b may be mounted on the lower plate 824a while being spaced apart from the lower plate 824a. For example, the upper plate 824b or lower plate 824a may be metal. The pillar C may be provided on the lower plate 824a to support the upper plate 824b. The upper plate 824b may have an opening OP.

A power supply unit (or power supply) 826 may be positioned between the upper plate 824b and the lower plate 824a. The power supply unit 826 may be located on or attached to the lower plate 824a and may be in contact with the lower plate 824a. Heat generated from the power supply unit 826 may be transmitted to the lower plate 824a or may be emitted through the opening OP. The third PCB 825 may be located on the second PCB 822 or adjacent to the power supply unit 826.

The back cover 894R may be located behind the first PCB 821, the second PCB 822, the third PCB 825, and the power supply unit 826. The back cover 894R may cover the opened rear side of the housing 800. The back cover 894R may have vent holes VH1 to VH3. The vent holes VH1 to VH3 may include a first vent hole VH1, a second vent hole VH2, and a third vent hole VH3. The first vent hole VH1, the second vent hole VH2, and the third vent hole VH3 may be sequentially arranged on the back cover 894R.

The first vent hole VH1 and/or the second vent hole VH2 may be positioned adjacent to the second PCB 822 and/or the third PCB 825. The third vent hole VH3 may be located adjacent to the first PCB 821 and/or the power supply unit 826. The outside air may be introduced through the first vent hole VH1 and/or the second vent hole VH2. The inside air may be discharged through the third vent hole VH3.

The inflow fan 827 may be located behind the first speaker unit 891. The inflow fan 827 may be located on the third PCB 825. The inflow fan 827 may be referred to as a first fan 827. The discharge fan 828 may be located behind the second speaker unit 892. The discharge fan 828 may be referred to as a second fan 828.

Figure 50:
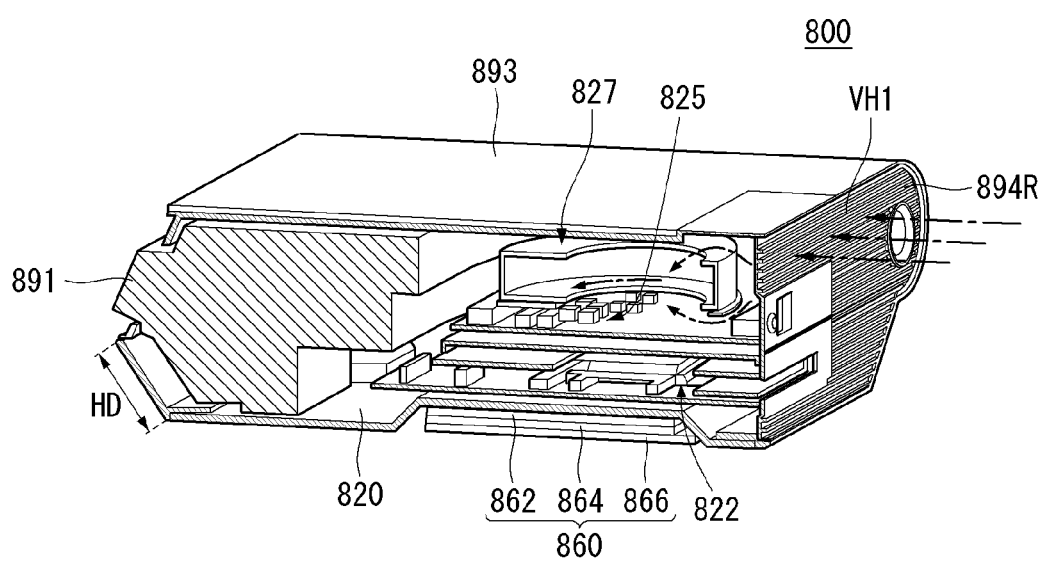
FIGS. 50 to 55 illustrate a heat dissipation structure according to an embodiment.
Figure 51:
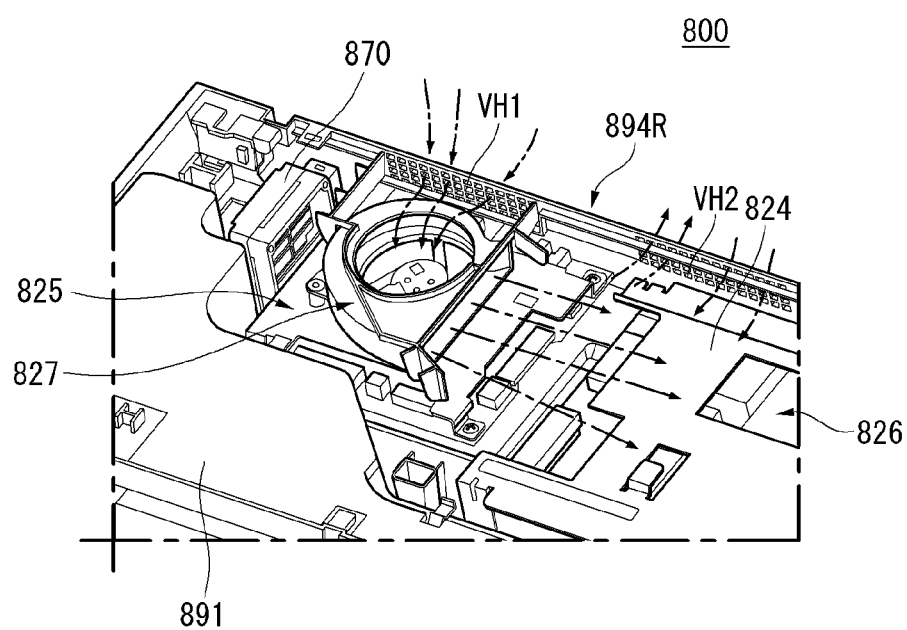
Figure 52:
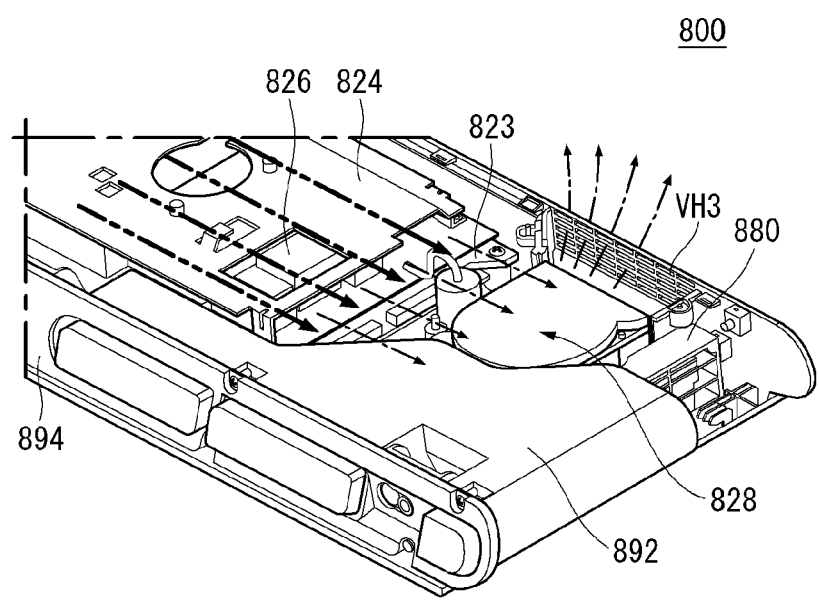

Referring to FIGS. 50 to 52, the outside air may be introduced through the first vent hole VH1 by a pressure difference between the inside and the outside of the housing 800 generated by the inflow fan 827. At this time, heat generated from the second PCB 822 and/or the third PCB 825 may be cooled by the outside air while the outside air flows into the inflow fan 827 from the outside of the housing 800. The inflow fan 827 may blow the outside air toward the power supply unit 826 (see FIG. 47). The air flowing from the inflow fan 827 toward the power supply unit 826 (see FIG. 47) may be discharged through the second vent hole VH2 or the outside air may be introduced through the second vent hole VH2.

The discharge fan 828 may discharge the air that passes through the power supply unit 826 to the outside of the housing 800 through the third vent hole VH3. The inflow fan 827 may suck the outside air into the housing 800. The inflow fan 827 may generate an air flow toward the discharge fan 828. When the discharge fan 828 discharges the inside air to the outside of the housing 800, forced circulation convection may occur. The heat generated inside the housing 800 may be effectively discharged to the outside of the housing 800 by the forced circulation convection.

Figure 53:
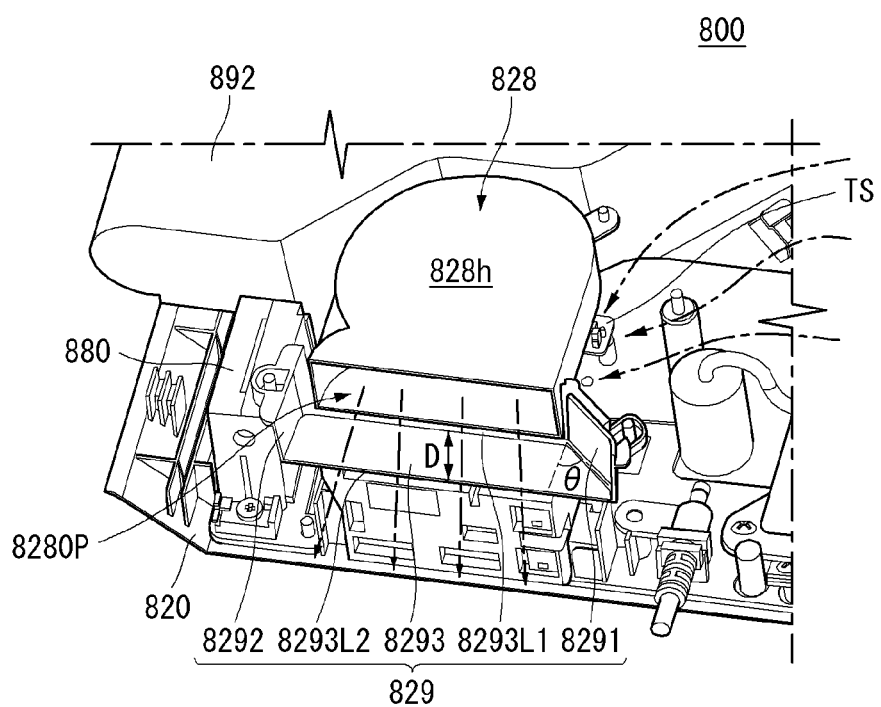

Referring to FIGS. 52 and 53, the discharge fan 828 may include a fan housing 828h. The fan housing 828h may have an opening 828OP. The opening 828OP of the fan housing 828h may face the third vent hole VH3. The duct 829 may be located at a side of the fan housing 828h. The duct 829 may include a floor 8293, a first wall 8291, and a second wall 8292. The floor 8293 may be located in front of the opening 828OP of the fan housing 828h.

The floor 8293 may have a length greater than the length of the opening 828OP of the fan housing 828h. The floor 8293 may have a first side 8293L1 whose length is substantially the same as the length of the opening 828OP of the fan housing 828h and a second side 8293L2 of which length is greater than the length of the opening 828OP of the fan housing 828h. The first side 8293L1 of the floor 8293 may be adjacent to the opening 828OP of the fan housing 828h in comparison with the second side 8293L2. The floor 8293 may have a certain width D. The width D of the floor 8293 may be the distance between the first side 8293L1 and the second side 8293L2 of the floor 8293. The floor 8293 may separate the fan housing 828h from the third vent hole VH3, and then the discharge noise generated around the third vent hole VH3 may be reduced.

The first wall 8291 and the second wall 8292 may be located in front of the opening 828OP of the fan housing 828h. The first wall 8291 may be located at an end of the floor 8293. The second wall 8292 may be located at another end of the floor 8293. The second wall 8292 may face the first wall 8291. The second wall 8292 may have an opening angle (θ). A distance between the second wall 8292 and the first wall 8291 may increase from the opening 828OP of the fan housing 828h to the third vent hole VH3. The first wall 8291 and the second wall 8292 may form a radial shape as a whole.

The amount of air discharged from the discharge fan 828 toward the second wall 8292 may be greater than the amount of air discharged from the discharge fan 828 toward the first wall 8291. By making the second wall 8292 have an opening angle theta, the noise due to the flow toward the second wall 8292 may be reduced, and the pressure of air discharged may be reduced.

The temperature sensor TS may be located adjacent to the discharge fan 828. The temperature sensor TS may measure the temperature of the air near the discharge fan 828. The air near the discharge fan 828 may have the highest temperature among the air flowing inside the housing 800. As the temperature sensor TS measures the temperature of the air near the discharge fan 828, the cooling temperature inside the housing 800 may be calculated. The rotation speed of the inflow fan 827 (see FIG. 51) and/or the discharge fan 828 may be adjusted based on the calculated cooling temperature.

The rotational speed of the inflow fan 827 and/or the discharge fan 828 may be adjusted in accordance with the magnitude of the sound provided by the display device. For example, as the volume of sound provided by the display device increases, the rotational speed of the inflow fan 827 and/or the discharge fan 828 may increase. As another example, as the volume of the sound provided by the display device is reduced, the rotation speed of the inflow fan 827 and/or the discharge fan 828 may be reduced. The heat being discharged may be adjusted in accordance with the magnitude of the sound provided by the display device.

The rotation of the inflow fan 827 and/or the discharge fan 828 may be related to the operation of the display device. The inflow fan 827 and/or the discharge fan 828 may operate as electric power is applied to the display device. Even if electric power is supplied to the display device, the inflow fan 827 and/or the discharge fan 828 may not operate when the temperature inside the housing 800 is below a certain level.

Figure 54:
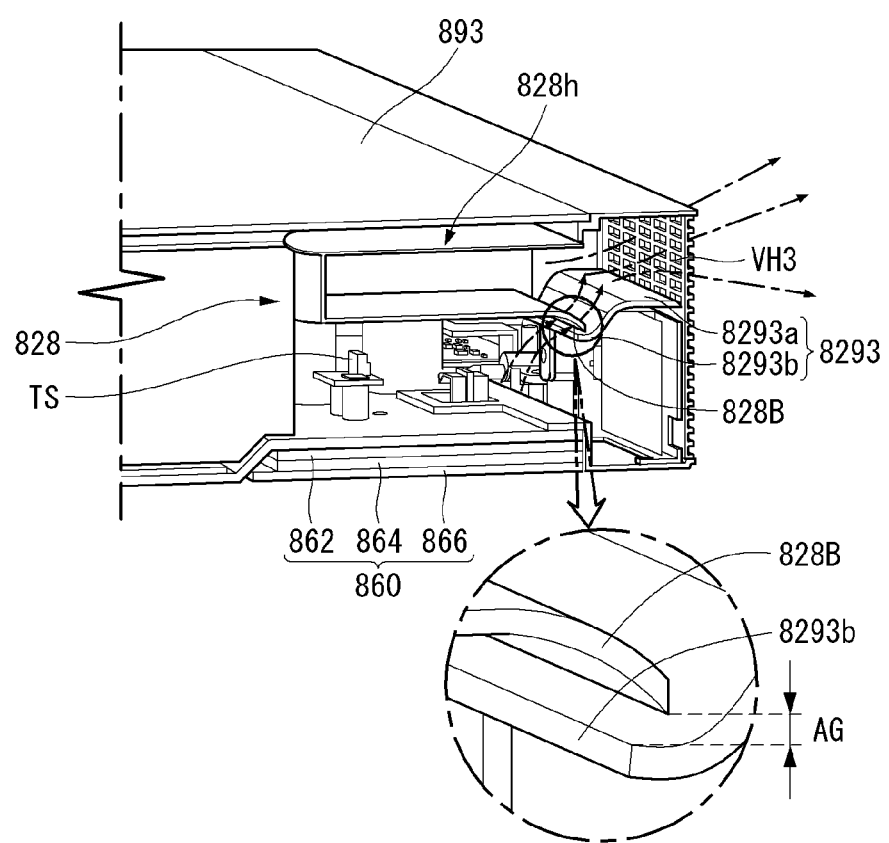

Referring to FIG. 54, the floor 8293 of the duct 829 may have an upper floor 8293a and a lower floor 8293b. The upper floor 8293a may be located above the lower floor 8293b and may be connected to the lower floor 8293b. The upper floor 8293a and the lower floor 8293b may form a wave or a curve as a whole. The lower floor 8293b may be spaced apart from the bottom 828B of the fan housing 828h. A gap AG may be formed between the lower floor 8293b and the bottom 828B of the fan housing 828h.

When air is discharged from the discharge fan 828 toward the third vent hole VH3, the air flow may be formed around the gap AG. A pressure difference may occur near the gap AG due to the air flow formed around the gap AG. Hot air formed at the lower side of the discharge fan 828 may pass through the gap AG and may flow into the third vent hole VH3.

Figure 55:
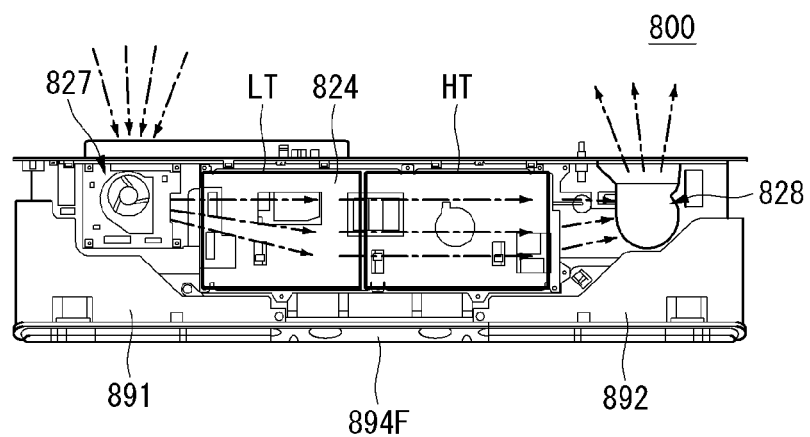

Referring to FIG. 55, the low temperature heat source LT may be positioned adjacent to the inflow fan 827, and the high temperature heat source HT may be located adjacent to the discharge fan 828. For example, the low temperature heat source LT may be the second PCB 822 (see FIG. 47) and/or the third PCB 825 (see FIG. 47), and the high temperature heat source HT may be the power supply unit 826 (see FIG. 47). The outside air flowing from the inflow fan 827 may go by the low heat source LT and the high heat source HT and may be discharged to the outside of the housing 800. The outside air flowing in from the inflow fan 827 may absorb heat from the low heat source LT and the high heat source HT. Accordingly, heat dissipation inside the housing 800 may be effectively performed.

Accordingly, an object of the present disclosure is to address the above-described and other problems. The object of the present disclosure may be to solve the above-mentioned problems and other problems. Another object of the present disclosure may be to secure rigidity of the slim display device. Another object of the present invention may be to secure a mounting balance of the display device.

A display device may comprise a display panel; a plate including: a first part at a rear of the display panel, wherein the display panel is fixed on the first part; and a second part extended from a lower side of the first part, the second part bent toward a front of the first part from the first part; and a housing at a rear of the second part of the plate, the housing coupled with the second part of the plate. The first part of the plate may be formed integrally with the second part of the plate, and the first part of the plate may include a transparent material.

The display device may further comprise: at least one opening formed at the second part of the plate; a front bracket positioned at a front of the second part of the plate; a rear bracket positioned at the rear of the second part of the plate; and at least one fastening member passing through the at least one opening and the front bracket, the at least one fastening member fixed to the rear bracket. The rear bracket may include a support column extended toward a rear of the rear bracket, the at least one fastening member may include: a first fastening member passing through the front bracket and the at least one opening, the first fastening member inserted into the support column; and a second fastening member passing through the front bracket and the at least one opening, the second fastening member coupled with the housing.

The housing may include: a supporter frame forming a bottom of the housing; and a supporter fixed to the supporter frame, the supporter may include: a body; an insertion portion recessed from a front surface of the body; and a fixing hole formed on the front surface of the body, the support column may be inserted into the insertion portion of the supporter, and the second fastening member may be inserted into the fixing hole of the supporter. The rear bracket may include a recessed portion recessed toward the rear of the rear bracket from a front of the rear bracket, the support column may be formed on a rear surface of the recessed portion of the rear bracket, the supporter may include a depression in which the recessed portion is inserted, and at least one of the insertion portion and the fixing hole may be formed in the depression.

A lower surface of the recessed portion may be in contact with the depression. The housing may include: a supporter frame forming a bottom of the housing; a supporter fixed to the supporter frame; and a weight positioned at a rear of the supporter, the weight coupled with the supporter frame. The supporter frame may include a dome formed at a bottom of the supporter frame, and the weight may be accommodated in the dome.

The display device may further comprise a speaker cover covering a front surface of the front bracket, the front bracket may include a flange formed at a front portion of the front bracket, and the speaker cover may be coupled with the flange of the front bracket. The housing may include: a supporter frame forming a bottom of the housing; a supporter fixed to the supporter; and a tilting unit positioned at a rear of the supporter, the tilting unit mounted on the supporter frame, the tilting unit may include: a case; a shaft rotatably installed in the case, a part of the shaft exposed outside of the case; a mover installed in the case, the mover configured to move on the shaft, the mover including a first inclined surface at a lower portion of the mover; a slider located at a lower of the mover, the slider including a second inclined surface in contact with the first inclined surface; and a leg extended toward a lower of the slider from the slider, the leg passing through the supporter frame and movable toward outside of the case.

The display device may further comprise: a line hole formed at the first part of the plate, the line hole facing a rear surface of the display panel; and a cable connected to the display panel, the cable passing through the line hole. The display device may further comprise a line ring fitted in the line hole, and the line ring may include: a ring plate being in contact with a rear surface of the first part of the plate; and a ring wall connected to the ring plate, the ring wall being in contact with an inner surface of the line hole.

The display device may further comprise: a first buffer layer positioned between the front bracket and the second part; and a second buffer layer positioned between the rear bracket and the second part. The first buffer layer may be attached to the front bracket and a front surface of the second part of the plate, and the second buffer layer may be attached to the rear bracket and a rear surface of the second part of the plate. The rigidity of the slim display device may thus be secured.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel having a first panel surface that faces a first direction and a second panel surface that faces a second direction opposite the first direction;
    a plate having a first plate surface fixed to the second panel surface of the display panel and a second plate surface opposite the first plate surface, wherein the plate includes a first portion to which the display panel is fixed and a second portion that extends at a predetermined angle from the first portion, the second portion being angled toward the first direction;
    a housing fixed to the second portion of the plate, wherein the second portion of the plate is fixed to a first edge of the housing,
    a module cover coupled to a rear of the display panel by an adhesive sheet, the module cover including a plurality of fixing pins;
    a bracket including a plurality of fastening holes disposed corresponding to the plurality of fixing pins; and
    an adhesive member disposed between the bracket and the first portion of the plate,
    wherein the bracket is fastened to the module cover by inserting the plurality of fixing pins into the plurality of fastening holes, respectively,
    wherein one surface of the bracket is fixed to the first portion of the plate by the adhesive member.

2. The display device of claim 1, wherein the first portion of the plate is formed integrally with the second portion of the plate, and wherein the first portion of the plate includes a transparent material.

3. The display device of claim 1, further comprising:
    at least one opening formed at the second portion of the plate;
    a first bracket configured to be attached to a first surface of the second portion of the plate;
    a second bracket configured to be attached to a second surface of the second portion of the plate; and
    at least one fastening member configured to pass through the at least one opening and the first bracket, the at least one fastening member configured to be fixed to the second bracket.

4. The display device of claim 3, wherein the second bracket includes a support column that extends in the second direction, and wherein the at least one fastening member includes:
    a first fastening member configured to pass through the first bracket and the at least one opening, the first fastening member configured to be inserted into the support column; and
    a second fastening member configured to pass through the first bracket and the at least one opening, the second fastening member configured to be coupled with the housing.

5. The display device of claim 4, wherein the housing includes:
    a supporter frame that forms a bottom of the housing; and
    a supporter fixed to the supporter frame, wherein the supporter includes:
    a body;
    an insertion hole recessed from a first surface of the body; and
    a fixing hole formed on the first surface of the body, wherein the support column is configured to be inserted into the insertion hole of the supporter, and wherein the second fastening member is configured to be inserted into the fixing hole of the supporter.

6. The display device of claim 5, wherein the second bracket includes a recess that is recessed from the second bracket in the second direction from a first surface of the second bracket, wherein the support column is formed on the recess of the second bracket, wherein the supporter includes a depression in which the recess is configured to be inserted, and wherein at least one of the insertion hole and the fixing hole is formed in the depression.

7. The display device of claim 6, wherein a lower surface of the recess is in contact with the depression.

8. The display device of claim 1, wherein the housing includes:
a supporter frame that forms a bottom of the housing;
at least one supporter fixed to the supporter frame; and
a weight positioned at a rear of the at least one supporter, the weight configured to be coupled with the supporter frame.

9. The display device of claim 8, wherein the supporter frame includes a dome formed at a bottom of the supporter frame, and wherein the weight is configured to be accommodated in the dome.

10. The display device of claim 3, further comprising a speaker cover that covers an exposed surface of the first bracket, wherein the first bracket includes a flange formed at a first portion of the first bracket, and wherein the speaker cover is coupled with the flange of the first bracket.

11. The display device of claim 1, wherein the housing includes:
a supporter frame that forms a bottom of the housing;
at least one supporter fixed to the supporter frame; and
a tilting bracket positioned at a rear of the supporter frame, the tilting bracket being mounted on the supporter frame, wherein the tilting bracket includes:
a case;
a screw rotatably installed in the case, a part of the screw being exposed outside of the case;
a mover installed in the case, the mover configured to move axially along the screw, the mover including a first inclined surface;
a slider having a second inclined surface in contact with the first inclined surface; and
a leg that extends from the slider, wherein the leg passes through the supporter frame and is configured to project outside of the case at variable lengths depending on a location of the mover.

12. The display device of claim 1, further comprising:
a line hole formed at the first portion of the plate, the line hole facing the second panel surface of the display panel; and
a cable connected to the display panel, wherein the cable is configured to pass through the line hole.

13. The display device of claim 12, further comprising a line ring configured to fit into the line hole, wherein the line ring includes:
a ring plate configured to be in surface contact with the first portion of the plate; and
a ring wall connected to the ring plate, the ring wall being in contact with an inner edge of the line hole.

14. The display device of claim 3, further comprising:
a first buffer layer provided between the first bracket and the second portion; and
a second buffer layer provided between the second bracket and the second portion.

15. The display device of claim 14, wherein the first buffer layer is attached to the first bracket and the first surface of the second portion of the plate, and wherein the second buffer layer is attached to the second bracket and the second surface of the second portion of the plate.

16. A display device, comprising:
a plate having a first portion and a second portion that extends at a prescribed angle from the first portion, wherein each of the first portion and the second portion has a first plate surface and a second plate surface opposite the first plate surface;
a display panel having a first panel surface facing a first direction and a second panel surface facing a second direction opposite the first direction, wherein the second panel surface is fixed to the first plate surface of the first portion of the plate;
a module cover coupled to a rear of the display panel by an adhesive sheet, the module cover including a plurality of fixing pins and configured to cover at least one printed circuit board (PCB) that is connected to the display panel;
a housing attached to the second portion of the plate, wherein the second plate surface of the second portion is attached to a first edge of the housing, and the housing extends in the second direction,
a bracket including a plurality of fastening holes disposed corresponding to the plurality of fixing pins; and
an adhesive member disposed between the bracket and the first portion of the plate,
wherein the bracket is fastened to the module cover by inserting the plurality of fixing pins into the plurality of fastening holes, respectively,
wherein one surface of the bracket is fixed to the first portion of the plate by the adhesive member.

17. The display device of claim 16, further comprising:
a first bracket configured to contact the first plate surface of the second portion of the plate; and
a second bracket configured to contact the second plate surface of the second portion of the plate, wherein the first bracket and the second bracket are connected to each other with at least one first fastening member that passes through the first bracket and at least one coupling hole of the second portion of the plate to be fixed to a support column formed on the second bracket, and wherein the support column is configured to extend in the second direction when the first bracket and second bracket are connected to each other.

18. The display device of claim 17, wherein the housing comprises:
a supporter frame; and
at least one support attached to the supporter frame and configured to support the plate, wherein the at least one support includes at least one countersink including an insertion hole and a fixing hole, wherein the support column is configured to be inserted into the insertion hole, and wherein the first and second brackets are configured to be attached to the at least one support through at least one second fastening member that passes through the first bracket and the second bracket and is fixed in the fixing hole.

19. The display device of claim 16, wherein the housing includes at least one tilting bracket, wherein the at least one tilting bracket includes:
a case;
a screw rotatably installed in the case, a part of the screw being exposed outside of the case;
a mover installed in the case, the mover configured to move axially along the screw, the mover including a first inclined surface;
a slider having a second inclined surface in contact with the first inclined surface; and
a leg that extends from the slider, wherein the leg passes through the housing and is configured to project outside of the case at variable lengths depending on a location of the mover.

20. The display device of claim 16, wherein the housing includes:
- a supporter frame that forms a bottom of the housing;
- at least one support fixed to the supporter frame; and
- a weight positioned at a rear of the at least one support, the weight configured to be coupled with the supporter frame.

21. The display device of claim 1, wherein an extension direction of the first portion is different from an extension direction of the second portion such that the predetermined angle is between 0° and 90°.

22. The display device of claim 1, wherein a height of the display panel is less than or equal to a height of the first portion of the plate.

* * * * *